United States Patent
Park et al.

(10) Patent No.: US 10,955,965 B2
(45) Date of Patent: Mar. 23, 2021

(54) DISPLAY DEVICE INCLUDING INPUT DETECTION UNIT

(71) Applicant: SAMSUNG DISPLAY CO., LTD., Yongin-si (KR)

(72) Inventors: Junhyun Park, Suwon-si (KR); Dongwoo Kim, Yongin-si (KR); Sunkwang Kim, Seoul (KR); Kangmoon Jo, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/458,277

(22) Filed: Jul. 1, 2019

(65) Prior Publication Data

US 2020/0110525 A1 Apr. 9, 2020

(30) Foreign Application Priority Data

Oct. 5, 2018 (KR) ........................ 10-2018-0119208

(51) Int. Cl.
*G06F 3/041* (2006.01)
*G09G 3/3225* (2016.01)
(Continued)

(52) U.S. Cl.
CPC .......... *G06F 3/04164* (2019.05); *G06F 3/044* (2013.01); *G06F 3/0412* (2013.01);
(Continued)

(58) Field of Classification Search
CPC .... G06F 3/0412; G06F 3/04164; G06F 3/044; G06F 3/0446; G06F 2203/04112;
(Continued)

(56) References Cited

U.S. PATENT DOCUMENTS 10,216,305 B2 * 2/2019 Li ........................ G06F 3/04166
10,230,069 B2 * 3/2019 Choi ..................... H01L 27/323
(Continued)

FOREIGN PATENT DOCUMENTS

KR 1020150078332 7/2015
KR 1020170066767 6/2017
(Continued)

*Primary Examiner* — Mihir K Rayan
(74) *Attorney, Agent, or Firm* — F. Chau & Associates, LLC

(57) ABSTRACT

A display device includes a base substrate and an input detection unit. The base substrate includes a front surface and a tear surface that face each other, an active area, a peripheral area adjacent to the active area, a module hole in the active area, a routing area that surrounds the module hole, and a depression pattern that surrounds the module hole between the routing area and the module hole. The input detection unit includes first touch sensor units along a first direction, a first connection part that connects adjacent first touch sensor units, second touch sensor units arranged in a second direction that intersects the first direction, a second connection part that connects adjacent second touch sensor units: and a bridge line disposed in the routing area and connected to second touch sensor units adjacent to each other in the second direction with the module hole therebetween.

24 Claims, 19 Drawing Sheets

(51) Int. Cl.
H01L 27/32 (2006.01)
G06F 3/044 (2006.01)

(52) U.S. Cl.
CPC ......... G09G 3/3225 (2013.01); H01L 27/323 (2013.01); H01L 27/3244 (2013.01)

(58) Field of Classification Search
CPC .. G09G 3/3225; G09G 3/3233; H01L 27/323; H01L 27/3244; H01L 27/3223; H01L 27/3276
See application file for complete search history.

(56) References Cited

U.S. PATENT DOCUMENTS

| | | | | |
|---|---|---|---|---|
| 10,541,380 | B1* | 1/2020 | Sung | H01L 21/76205 |
| 10,553,819 | B2* | 2/2020 | Kim | H01L 27/3244 |
| 10,607,573 | B2* | 3/2020 | Silvanto | G06F 1/1686 |
| 2010/0026611 | A1* | 2/2010 | Igeta | G02F 1/136286 345/55 |
| 2012/0069241 | A1* | 3/2012 | Shiau | G06F 1/1605 348/373 |
| 2013/0094126 | A1* | 4/2013 | Rappoport | H01L 51/0097 361/679.01 |
| 2017/0108964 | A1* | 4/2017 | Sato | G06F 3/0446 |
| 2017/0162111 | A1* | 6/2017 | Kang | H01L 27/3276 |
| 2017/0237037 | A1* | 8/2017 | Choi | G04B 19/12 257/40 |
| 2017/0287992 | A1 | 10/2017 | Kwak et al. | |
| 2019/0079622 | A1* | 3/2019 | Choi | G06F 3/047 |
| 2019/0245159 | A1* | 8/2019 | Kim | H01L 51/5256 |

FOREIGN PATENT DOCUMENTS

| | | |
|---|---|---|
| KR | 1020170095444 | 8/2017 |
| KR | 1020170111827 | 10/2017 |

* cited by examiner

DISPLAY DEVICE INCLUDING INPUT DETECTION UNIT

CROSS-REFERENCE TO RELATED APPLICATIONS

This U.S. non-provisional patent application claims priority under 35 U.S.C. 119 from, and the benefit of Korean Patent Application No. 10-2018-0119208, filed on Oct. 5, 2018 in the Korean Intellectual Property Office, the contents of which are herein incorporated by reference in their entirety.

BACKGROUND

Technical Field

Embodiments of present disclosure herein are directed to a display device, and more particularly to a display device that includes an input detection unit.

Discussion of the Related Art

A display device is activated according to an electrical signal. Display devices are composed of various electronic components, such as a display unit for displaying an image, or an input detection unit for detecting an external input. Electronic components are electrically interconnected by variously arranged signal lines.

A display unit includes a light emitting element that generates an image. The input detection unit includes detection electrodes that detect an external input. A display device that includes a display unit and an input detection unit in one panel may have an increased thickness and an increased process cost.

SUMMARY

Embodiments of the inventive concept can provide a display device that includes a display panel provided with a module hole, which maintains display quality while electrically connecting touch sensor units that are disconnected by the module hole.

An embodiment of the inventive concept provides a display device that includes a base substrate, a circuit layer, a display element layer, a sealing layer, and an input detection unit.

The base substrate includes a front surface and a rear surface that face each other, an active area, a peripheral area adjacent to the active area, a module hole formed in the active area that penetrates through the front surface and the rear surface, a routing area that surrounding the module hole.

The circuit layer is disposed on the base substrate and includes a driving element that includes a thin film transistor.

The display element layer is disposed on the circuit layer and includes a light emitting element disposed in the active area.

The sealing layer is disposed on the display element layer and seals the organic light emitting diode.

The input detection unit may be disposed on the sealing layer.

The input detection unit includes first touch sensor units, a first connection part, second touch sensor units, a second connection part, and a second bridge line. The first touch sensor units are arranged along a first direction. The first connection part connects adjacent first touch sensor units. The second touch sensor units are arranged along a second direction that intersects the first direction. The second connection part connects adjacent second touch sensor units and is disposed on a different layer from the first connection part. The second bridge line is disposed in the routing area and connects second touch sensor units adjacent to each other in the second direction with the module hole therebetween.

The routing area on the plane is surrounded by the active region.

The light emitting element includes a first light emitting element and a second light emitting element adjacent to each other in the first direction with the module hole therebetween, and a third light emitting element and a fourth light emitting element adjacent to each other in the second direction. The driving element may include first to fourth driving elements connected to the first to fourth light emitting elements. The circuit layer may include a first signal line and a second signal line. The first signal line may be connected to the first and second driving elements, and a pan of the first signal line may be disposed in the routing area. The second signal line may be disposed on a different layer from the first signal line and may be connected to the third and fourth driving elements, and a pan of the second signal line may be disposed in the routing area on a plane.

The first touch sensor units, the second touch sensor units, and the second connection part may be disposed on the same layer. The second bridge line may be disposed on the same layer as the second connection part.

The input detection unit may further include a first bridge line disposed in the routing area and connected to the first touch sensor units adjacent to each other in the first direction with the module hole therebetween, and.

The second bridge line may be disposed on the same layer as the second touch sensor units. The first bridge line may be disposed on the same layer as the first connection part.

The second bridge line may be disposed on the same layer as the first connection part.

The first bridge line may include first through third sub-bridge lines. The first and second sub-bridge lines may be disposed on the same layer as the second bridge line and may be connected to each of the first touch sensor units adjacent to each other in the first direction with the module hole therebetween. The third sub-bridge line may be disposed on a layer different from the second bridge line, crosses the second bridge line on a plane, and is connected between the first and second sub-bridge lines.

The second bridge line may be disposed on the same layer as the first connection part. The first bridge line may be disposed on a different layer from the first touch sensor units, the first connection part, the second touch sensor units, the second connection part, and the second bridge line.

The base substrate may be provided with a depression pattern that surrounds the module hole between the routing area and the module hole in a plane.

The base substrate may include a base layer and an auxiliary layer that covers the entire surface of the base layer. The depression pattern may penetrate the auxiliary layer into the base layer.

A display device according to an embodiment of the inventive concept may include a base substrate, a circuit layer, a display element layer, a sealing layer, and an input detection unit.

The base substrate includes a front surface and a rear surface facing each other, an active area, a peripheral area adjacent to the active area, a module hole formed in the active area that penetrates through the front surface and the rear surface, and a hole area that surrounds the module hole.

The circuit layer is disposed on the base substrate and may include a thin film transistor.

The display element layer may be disposed on the circuit layer and may include a light emitting element disposed in the active region.

The sealing layer is disposed on the display element layer and seals the organic light emitting diode.

The input detection unit is disposed on the sealing layer.

The input detection unit may include a first touch line, a second touch line, and a bridge line. The first touch line may include first touch sensor units arranged along a predetermined direction. The second touch line may be insulated from and intersects the first touch line. The bridge line may be connected to first touch sensor units adjacent to each other in the predetermined direction with the module hole therebetween, and may be disposed in the routing area.

DETAILED DESCRIPTION

Figure 1:
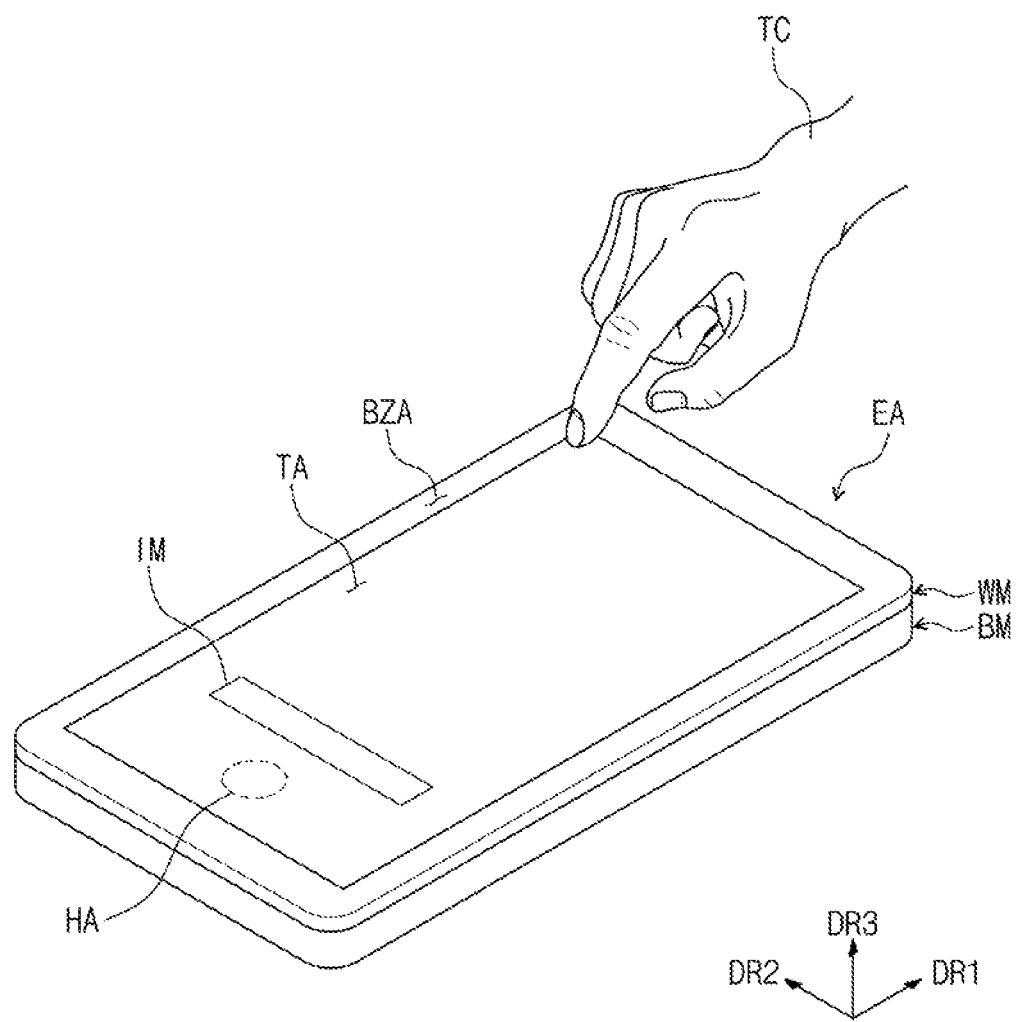
FIG. 1 is a perspective view of a display device according to an embodiment of the inventive concept.

In this specification, when it is mentioned that a component, an area, a layer, a pan, etc., is referred to as being "on", "connected to" or "combined to" another component, this means that the component may be directly on, connected to, or combined to the other component or a third component therebetween may be present.

Like reference numerals may refer to like elements. In addition, in the drawings, the thicknesses, proportions, and dimensions of components may be exaggerated for effective description.

Hereinafter, embodiments of the inventive concept will be described with reference to the drawings.

Figure 2:
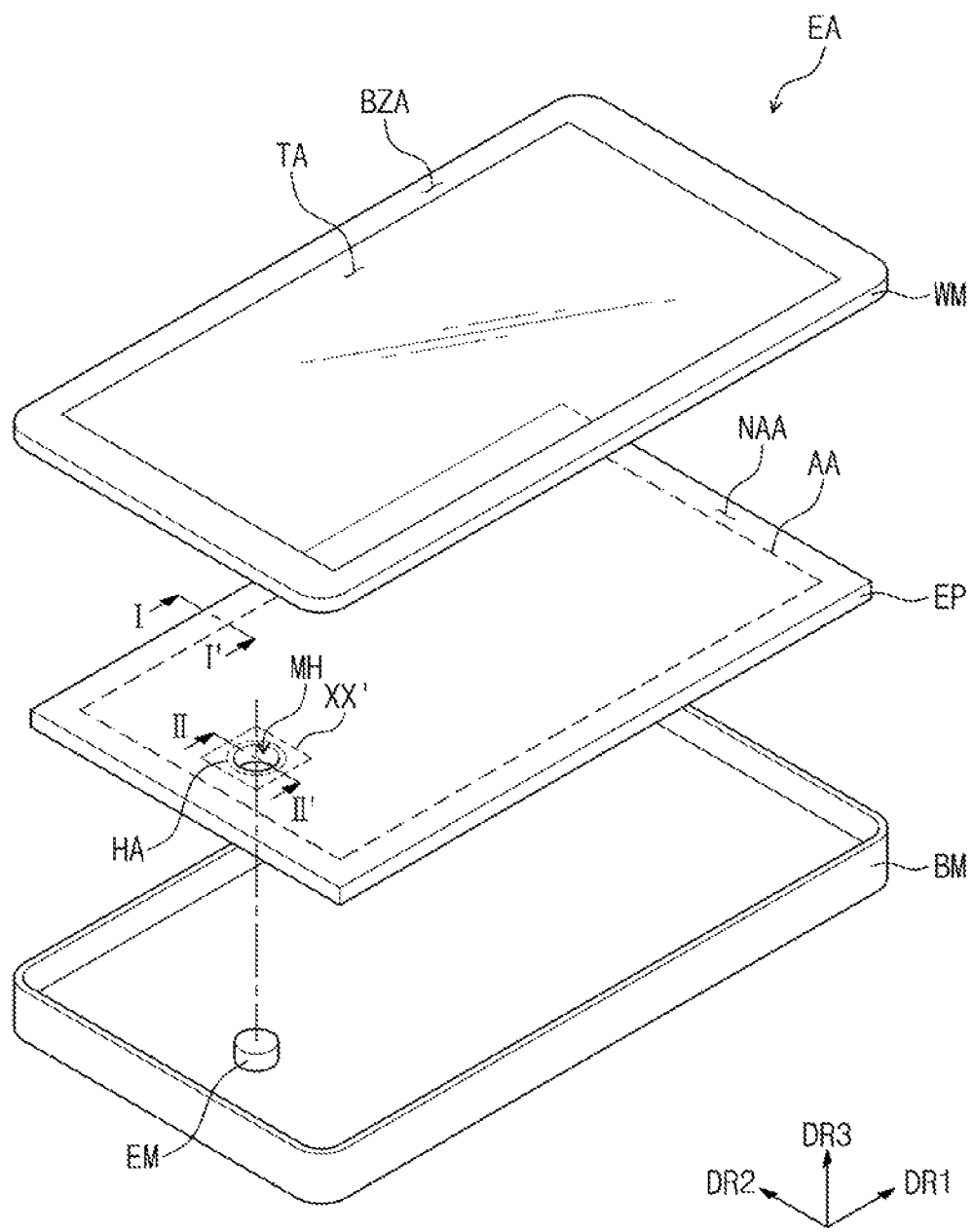
FIG. 2 is an exploded perspective view of a display device shown in FIG. 1.
Figure 3:
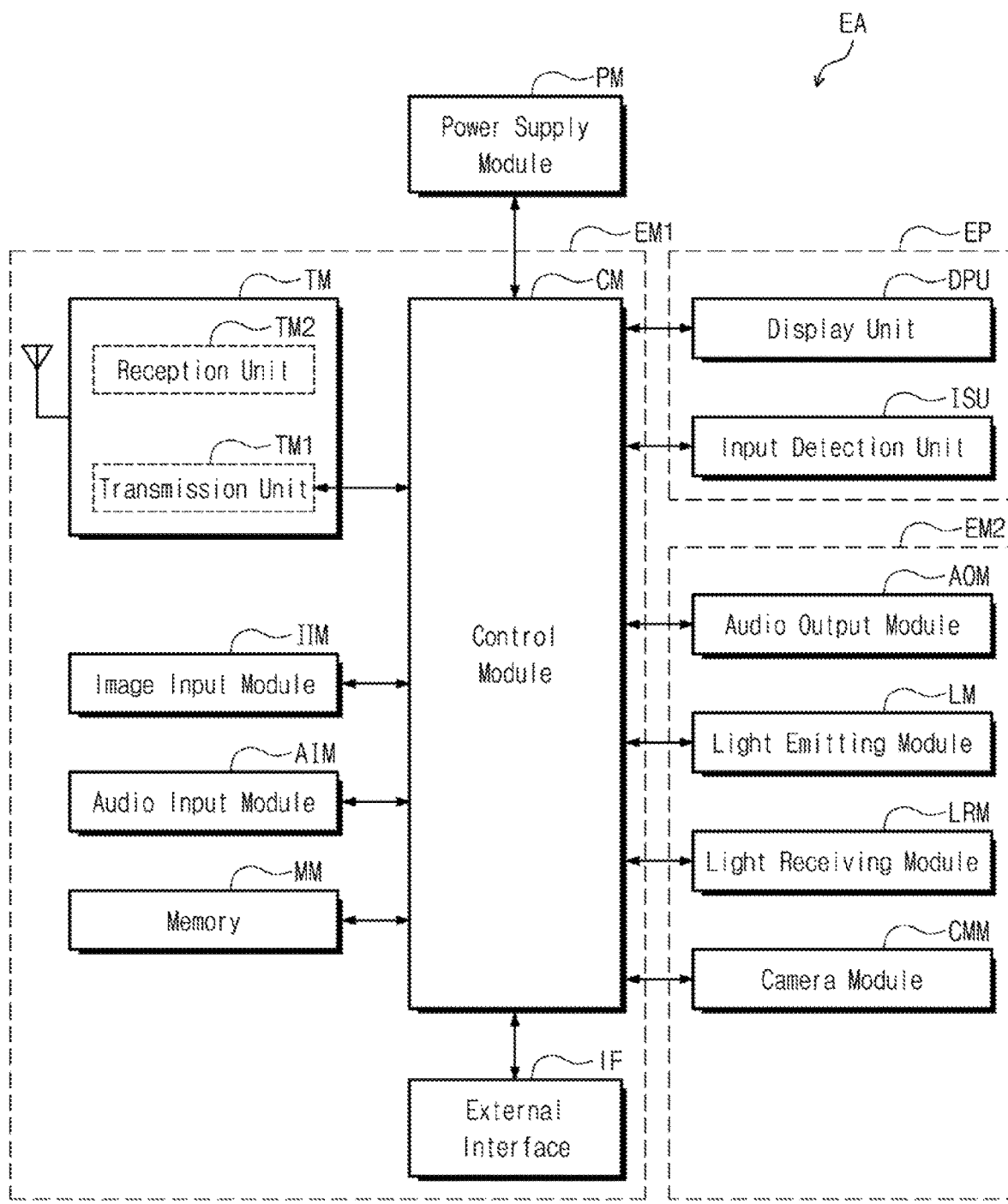
FIG. 3 is a block diagram of a display device shown in FIG. 1.

FIG. 1 is a perspective view of a display device according to an embodiment of the inventive concept. FIG. 2 is an exploded perspective view of a display device shown in FIG. 1. FIG. 3 is a block diagram of a display device shown in FIG. 1. Hereinafter, a display device according to an embodiment of the inventive concept will be described with reference to FIGS. 1 to 3.

According to an embodiment, a display device EA is a device that is activated in response to an electrical signal. The display device EA can be implemented according to various embodiments. For example, the display device EA may be one of a tablet, a notebook, a computer, a smart television, etc. In an exemplary, non-limiting embodiment, the display device EA is a smart phone.

As shown in FIG. 1, according to an embodiment, the display device EA displays an image IM on a front surface. The front surface is parallel to a plane defined by a first direction DR1 and A second direction DR2. The front surface includes a transmission area TA and a bezel area BZA adjacent to the transmissive area TA.

According to an embodiment, the display device EA displays the image IM in the transmission area TA. An Internet search window is shown as an example of the image IM in FIG. 1. FIG. 1 shows the transmission area TA as having a rectangular shape parallel to the plane of the first direction DR1 and the second direction DR2. However, this is an example, and the transmission area TA may have various other shapes and is not limited to any one embodiment.

According to an embodiment, the bezel area BZA is adjacent to the transmission area TA. FIG. 1 shows the bezel area BZA as surrounding the transmission area TA. However, this is an example, and the bezel area BZA may be disposed adjacent to only one side, two sides or three sides of the transmission area TA, or may be omitted. A display device according to an embodiment of the inventive concept includes various embodiments and is not limited to any one embodiment.

According to an embodiment, a direction normal to the front surface corresponds to a thickness direction DR3, hereinafter referred to as a third direction, of the display device EA. In a present embodiment, the front or upper surface and the back or lower surface of each member are defined with reference to the direction in which the image IM is displayed. The front surface and the back surface are opposed to each other in the third direction DR3.

Moreover, according to an embodiment, the directions indicated by the first to third directions DR1, DR2, and DR3 may be transformed into other directions in other embodiments.

In addition, according to an embodiment, the display device EA can detect an externally received user input TC. The user's input TC may be one of various types of external inputs, such as a part of the user's body, light, heat, or pressure. FIG. 1 shows the user's input TC as being a user's finger applied to the front surface. But, this is an example, and as disclosed above, the user's input TC may take various forms. In addition, the display device EA may detect a user's input TC at a side surface or a back surface of the display device EA, depending on the structure of the display device EA, and is not limited to any one embodiment.

As shown in FIGS. 1 and 2, the display device EA according to an embodiment includes a display panel EP, a window member WM, an electronic module EM, and a housing member BM. Moreover, referring to FIG. 3, the display device EA further includes a first electronic module EM1, a second electronic module EM2, and a power supply module PM in addition to the display panel EP. In FIG. 2, some of the components shown in FIG. 3 are omitted for clarity of illustration. Hereinafter, the display device EA will be described in detail with reference to FIGS. 1 to 3.

According to an embodiment, the display panel EP displays the image IM and detect the external input TC. The display panel EP includes a display unit DPU that displays an image IM and an input detection unit ISU that detects an external input. In this embodiment, the input detection unit ISU detects an input applied to the window member WM.

According to an embodiment, the display panel EP includes an active area AA, a peripheral area NAA, and a hole area HA, which are separated on a plane. The active area AA is an area activated by an electrical signal.

In a present embodiment, the active area AA is where the image IM is displayed, and at the same time, where the external input TC is detected. However, this is a non-limiting example, and the area in the active area AA in which the image IM is displayed and the area in the active area AA in which the external input TC is detected may be separate from each other, and the display panel EP is not limited to any one embodiment.

According to an embodiment, the peripheral area NAA is covered by the bezel area BZA. The peripheral area NAA is adjacent to the active area AA. The peripheral area NAA surrounds the active area AA. A driving circuit or wiring, etc., that drive the active area AA is disposed in the peripheral area NAA.

In an embodiment, a flat display panel EP is assembled in which the active area AA and the peripheral area NAA face the window member WM. However, this is a non-limiting example, and a part of the peripheral area NAA of the display panel EP may be bent. According to an embodiment, a part of the peripheral area NAA is bent backwards toward the back surface of the display device EA, which reduces the bezel area BZA at the front surface of the display device EA. According to another embodiment, the display panel EP is assembled in a state where a part of the active area AA is bent. Alternatively, in the display panel EP according to another embodiment of the inventive concept, the peripheral area NAA is omitted.

According to an embodiment, the edge of the hole area HA is surrounded by the active area AA. In a plane, the hole area HA is spaced apart from the peripheral area NAA with the active area AA therebetween.

According to an embodiment, the hole area HA is where a module hole MH is formed that penetrates through the display panel EP along the third direction DR3. Accordingly, the module hole MH is surrounded on the plane by the active area AA.

According to an embodiment of the inventive concept, at least one module hole MH is formed on the display panel EP. The module hole MH is a through hole that connects the front surface of the display panel EP to the back surface. A component disposed on the back surface of the display panel EP that overlaps the module hole MH can be viewed through the module hole MH from the front surface of the display panel EP. On the other hand, in an embodiment, although the module hole MH is shown as having cylindrical shape that extends in the third direction DR3, the shape of the module hole MH is not limited thereto, and the module hole MH may have various other shapes, such as a polygonal column, an elliptic column, a cone, etc., and is not limited to any one embodiment.

According to an embodiment, the module hole MH overlaps the electronic module EM. Hie electronic module EM receives an external input through the module hole MH. The electronic module EM receives the signal input through the module hole MH and provides it to the display panel EP. The electronic module EM includes a receiver portion whose size is accommodated in or is at least similar to the module hole MH. A detailed description of the electronic module EM will be provided below.

According to an embodiment, the window member WM provides the front surface of the display EA. The window member WM is disposed on the front surface of the display panel EP to protect the display panel HP. For example, the window member WM includes a glass substrate, a sapphire substrate, or a plastic film. The window member WM may have a multi-layer or single-layer structure. For example, the window member WM may have a laminated structure of a plurality of plastic films bonded with an adhesive, or may have a laminated structure of a glass substrate and a plastic film bonded with an adhesive.

According to an embodiment, the window member WM can be divided into a transmission area TA and a bezel area BA. The transmission area TA transmits incident light. The transmission area TA has a shape that corresponds to the active area AA. For example, the transmission area TA overlaps the front surface or at least part of the active area AA. The image 1M displayed by the active area AA of the display panel EP can be viewed front the outside through the transmission area TA.

According to an embodiment, the bezel area BZA has a lower light transmittance as compared to the transmission area TA. The bezel area BZA determines the shape of rite transmission area TA. The bezel area BZA is adjacent to the transmission area TA and may surround the transmission area TA.

According to an embodiment, the bezel area BZA has a predetermined color. The bezel area BZA covers the peripheral area NAA of the display panel EP to prevent the peripheral area NAA from being externally visible. On the other hand, this is an example, and in the window member WM according to an embodiment of the inventive concept, the bezel area BZA may be omitted.

According to an embodiment, the housing member BM can be combined with the window member WM. The housing member BM provides the back surface of the display EA. The housing member BM combined with the window member WM defines an interior space.

According to an embodiment, the housing member BM includes a highly stiff material. For example, the housing member BM includes a plurality of frames or plates made of glass, plastic, or metal. The housing member BM stably protects the structures of the display device EA accommodated in the inner space from external impacts. The interior space of the housing member BM can accommodate the display panel EP and various components shown in FIG. 3.

Referring to FIG. 3, according to an embodiment, the display device EA includes a power supply module PM, a first electronic module EM1, and a second electronic module EM2. The power supply module PM supplies power necessary for the overall operation of the display device EA. The power supply module PM includes a conventional battery module.

According to an embodiment, the first electronic module EM1 and the second electronic module EM2 include various functional modules for operating the display device EA. The first electronic module EM1 may be directly mounted on a motherboard electrically connected to the display panel EP, or may be mounted on a separate board and electrically connected to the motherboard through a connector, etc.

According to an embodiment, the first electronic module EM1 includes a control module CM, a wireless communication module TM, an image input module IIM, an audio input module AIM, a memory MM, and an external interface IF. Some of the modules may not be mounted on the motherboard, but may be electrically connected to the motherboard through a flexible circuit board.

According to an embodiment, the control module CM controls the overall operation of the display device EA. The control module CM may be a microprocessor. For example, the control module CM activates or deactivates the display panel EP. The control module CM controls other modules, such as the image input module IIM or the audio input module AIM, based on the touch signal received from the display panel EP.

According to an embodiment, the wireless communication module TM transmits/receives a wireless signal to/from another terminal using a Bluetooth or a Wi-Fi line. The wireless communication module TM transmits/receives a voice signal using a general communication line. The wireless communication module TM includes a transmission unit TM1 that modulates and transmits a signal, and a reception unit TM2 that demodulates a received signal.

According to an embodiment, the image input module IIM processes an image signal and converts it into image data that can be displayed on the display panel EP. The audio input module AIM receives an external audio signal by a microphone in a recording mode, a voice recognition mode, etc., and converts it into electrical audio data.

According to an embodiment, the external interface IF serves as an interface to an external charger, a wired/wireless data port, or a card socket, such as a memory card, a SIM/UIM card, etc.

According to an embodiment, the second electronic module EM2 include an audio output module AOM, a light emitting module LM, a light receiving module LRM, and a camera module CMM. The components can be directly mounted on the motherboard, or mounted on a separate substrate and electrically connected to the display panel EP through a connector, or electrically connected to the first electronic module EM1.

According to an embodiment, the audio output module AOM converts audio data received from the wireless communication module TM or audio data stored in the memory MM and outputs the audio data as sound.

According to an embodiment, the light emitting module LM generates and outputs light. The light emitting module LM outputs infrared light. The light emitting module LM includes an LED element. The light receiving module LRM detects infrared light. The light receiving module LRM is activated when an infrared light of a predetermined frequency or higher is detected. The light receiving module LRM includes a CMOS sensor. After infrared light generated by the light emitting module LM is emitted, the infrared light is reflected by an external object, such as a user finger or a face, and the reflected infrared light is incident on the light receiving module LRM The camera module CMM captures an image of the outside.

According to an embodiment, the electronic module EM shown in FIG. 2 receives an external input transmitted through the module hole MH or may provide an output through the module hole MH. The electronic module EM may be any one of the modules of the first electronic module EM1 or the second electronic module EM2. For example, the electronic module EM may be a camera, a speaker, or a detection sensor of light or heat. The electronic module EM may detect an external object through the module hole MH or output a sound signal such as voice through the module hole MH. According to an embodiment, the remaining components of the first electronic module EM1 and the second electronic module EM2 may be disposed at different positions. However, this is an example, and the electronic module EM may include a plurality of modules that constitute the first electronic module EM1 and the second electronic module EM2, and is not limited to any one of the embodiments. In addition, the display device EA according to an embodiment of the inventive concept further includes a transparent member disposed between the electronic module EM and the display panel EP. The transparent member is an optically transparent film that transmits an external input through the module hole MH to the electronic module EM. The transparent member may be attached to the back surface of the display panel EP, or may be disposed between the display panel EP and the electronic module EM without a separate adhesive layer. The display device EA according to an embodiment of the inventive concept may have various structures and is not limited to any one embodiment.

According to an embodiment, the display panel EP includes the module hole MH, so that a separate space for the electronic module EM outside the peripheral area NAA can be omitted. In addition, by forming the module hole MH in the hole area HA surrounded by the active area AA, the electronic module EM overlaps the transmission area TA instead of the bezel area BZA. Accordingly, the area of the bezel area BZA is reduced, and a display device EA having a narrow bezel may be realized. Further, when the electronic module EM is accommodated in the module hole MH, a thinner display device EA can be realized.

Figure 4:
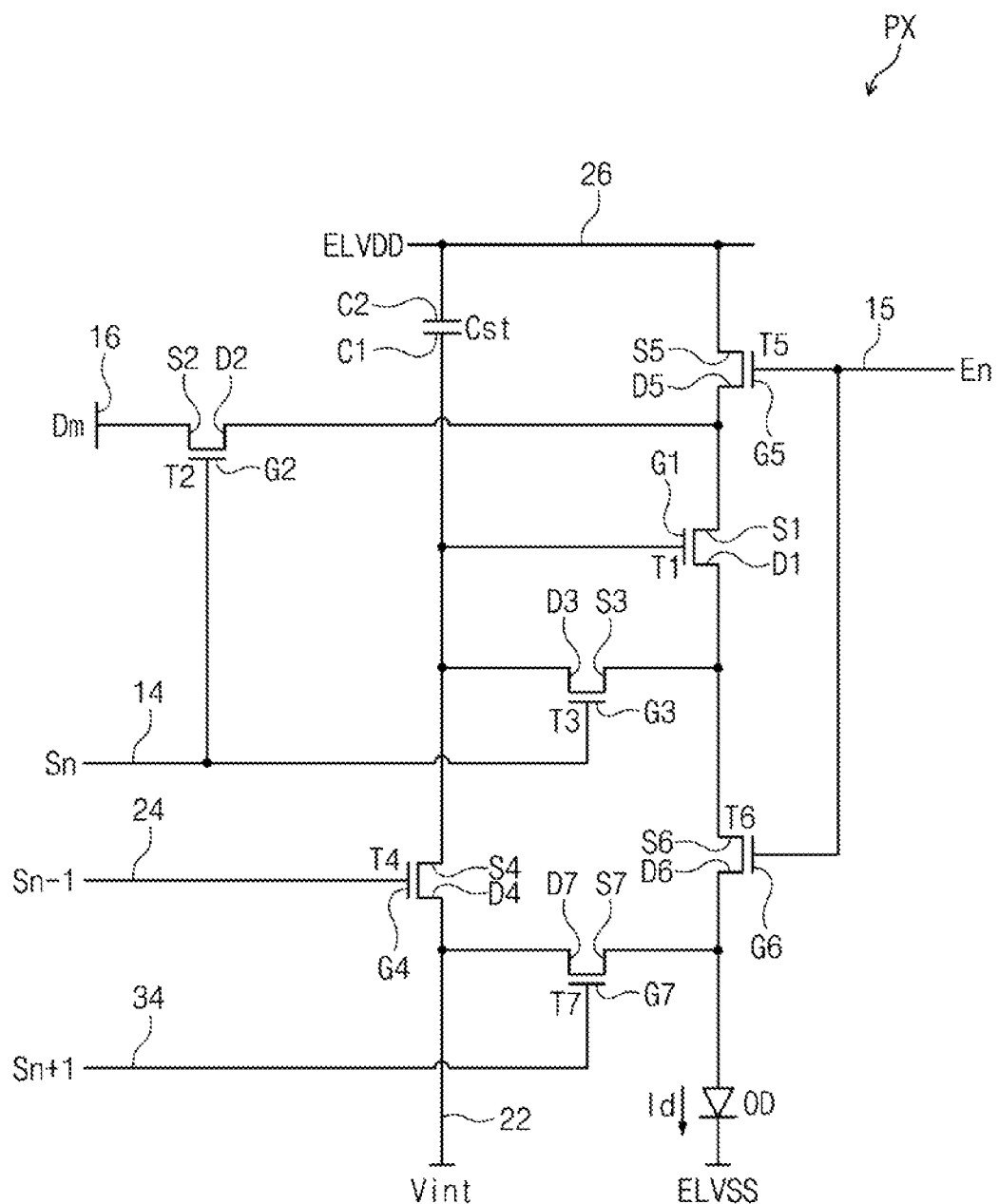
FIG. 4 is an equivalent circuit diagram of a pixel of a display panel.

FIG. 4 is an equivalent circuit diagram of a pixel of a display panel.

Referring to FIG. 4, a pixel PX according to an embodiment of the inventive concept includes a plurality of transistors T1 to T7, a storage capacitor Cst, and an organic light emitting diode OD.

Moreover, according to an embodiment, among the components of the pixel PX, except for the organic light emitting diode OD, the plurality of transistors T1 to T7, and the storage capacitor Cst are defined as driving elements.

According to an embodiment, the thin film transistors T1 to T7 include a driving transistor T1, a switching transistor T2, a compensation transistor T3, an initialization transistor T4, a first light-emission transistor T5, a second light-emission transistor T6, and a bypass transistor T7.

According to an embodiment, the pixel PX is connected to a first scanning line 14 that transmits an nth scanning signal Sn to the switching transistor T2 and the compensation transistor T3, a second scanning line 24 that transmits an (n−1)-th scanning signal Sn−1 to the initialization transistor T4, a third scanning line 34 that transmits an n+1th scanning signal Sn+1 to the bypass transistor T7, a light-emission line 15 that transmits a light-emission signal En to the first light-emission transistor T5 and the second light-emission transistor T6, a data line 16 that transmits a data signal Dm, a power line 26 that transmits a power supply voltage ELVDD, and an initialization line 22 that transmits an initialization voltage Vim that initializes the driving transistor T1.

According to an embodiment, the gate electrode G1 of the driving transistor T1 is connected to the first electrode C1 of the storage capacitor Cst. The source electrode S1 of the driving transistor T1 is connected to the power line 26 through the first emission control transistor T5. The drain electrode D1 of the driving transistor T1 is electrically connected to the anode of the organic light emitting diode OLED through the second light-emission control transistor T6. The driving transistor T1 receives the data signal Dm according to the switching operation of the switching transistor T2 and supplies the driving current Id to the organic light emitting diode OD.

According to an embodiment, the gate electrode G2 of the switching transistor T2 is connected to the first gate line 14. The source electrode S2 of the switching transistor T2 is connected to the data line 16. The drain electrode D2 of the switching transistor T2 is connected to the source electrode S1 of the driving transistor T1 and is connected to the power line 26 through the first light-emission control transistor T5. The switching transistor T2 is turned on according to the first scanning signal Sn received through the first gate line 14 and transmits the data signal Dm received through the data line 16 to the source electrode S1 of the driving transistor T1.

According to an embodiment, the gate electrode G3 of the compensation transistor T3 is connected to the first gate line 14. The source electrode S3 of the compensation transistor T3 is connected to the drain electrode D1 of the driving transistor T1 and is connected to the anode of the organic light emitting diode OLED through the second light-emission control transistor T6. The drain electrode D3 of the compensation transistor T3 is connected to the first electrode C1 of the storage capacitor Cst, the source electrode S4 of the initialization transistor T4, and the gate electrode G1 of the driving transistor T1. The compensation transistor T3 is turned on according to the nth scanning signal Sn received through the first gate line 14 and connects the gate electrode G1 to the drain electrode D1 of the driving transistor T1 for the diode connection of the driving transistor T1.

According to an embodiment, the gate electrode G4 of the initialization transistor T4 is connected to the second gate line 24. The drain electrode D4 of the initialization transistor T4 is connected to the initialization voltage line 22. The source electrode S4 of the initialization transistor T4 is connected to the first electrode C1 of the storage capacitor Cst, the drain electrode D3 of the compensation transistor T3, and the gate electrode G1 of the driving transistor T1. The initialization transistor T4 is turned on according to the (n−1)-th scanning signal Sn−1 received through the second gate line 24 and delivers the initialization voltage Vint to the gate electrode G1 of the driving transistor T1 to initialize the voltage of the gate electrode G1 of the driving transistor T1.

According to an embodiment, the gate electrode G5 of the first light-emission control transistor T5 is connected to the light-emission line 15. The first light-emission control transistor T5 is connected between the power line 26 and the driving transistor T1. The source electrode S5 of the first light-emission control transistor T5 is connected to the power line 26. The drain electrode D5 of the first emission control transistor T5 is connected to the source electrode S1 of the driving transistor T1 and the drain electrode D2 of the switching transistor T2. As the emission control signal En is applied to the gate electrode G5 of the first light-emission control transistor T5, the first light-emission control transistor T5 is turned on so that the driving current Id flows to the organic light emitting diode OD. The first light-emission control transistor T5 determines the timing at which the driving current Id flows to the organic light emitting diode OD.

According to an embodiment, the gate electrode G6 of the second light-emission control transistor T6 is connected to the light-emission line 15. The second light-emission control transistor T6 is connected between the driving transistor T1 and the organic light emitting diode OD. The source electrode S6 of the second light-emission control transistor T6 is connected to the drain electrode D1 of the driving transistor T1 and the source electrode S3 of the compensation transistor T3. The drain electrode D6 of the second emission control transistor T6 is electrically connected to the anode of the organic light emitting diode OD. The first light-emission control transistor T5 and the second light-emission control transistor T6 are turned on according to the light-emission control signal En received through the light-emission line 15. As the emission control signal En is applied to the gate electrode G6 of the first light-emission control transistor T5, the first light-emission control transistor T5 is turned on so that the driving current Id flows in the organic light emitting diode OD. The second light-emission control transistor T6 determines the timing at which the driving current Id flows to the organic light emitting diode OD.

According to an embodiment, the gate electrode G7 of the bypass transistor T7 is connected to the third gate line 34. The source electrode S7 of the bypass transistor T7 is connected to the anode of the organic light emitting diode OD. The drain electrode D4 of the initialization transistor T4 is connected to the initialization voltage line 22. The bypass transistor T7 is turned on according to the (n+1)-th scanning signal Sn+1 received through the third gate line 34 to initialize the anode of the organic light emitting diode OD.

According to an embodiment, the second electrode C2 of the storage capacitor Cst is connected to the power line 26. The first electrode C1 of the storage capacitor Cst is connected to the gate electrode G1 of the driving transistor T1, the drain electrode D3 of the compensation transistor T3, and the source electrode S4 of the initialization transistor T4.

According to an embodiment, the cathode of the organic light emitting diode OD receives the reference voltage ELVSS. The organic light emitting diode OD receives the driving current Id from the driving transistor T1 and emits light. The organic light emitting diode OD includes a light emitting material. An organic light emitting diode OD generates light of a color that corresponds to a light emitting material. The color of the light generated in the organic light emitting diode OD is any one of red, green, blue, or white.

In another embodiment of the inventive concept, the number and connections of the transistors T1 to T7 constituting the pixel PX may be variously changed.

Figure 5:
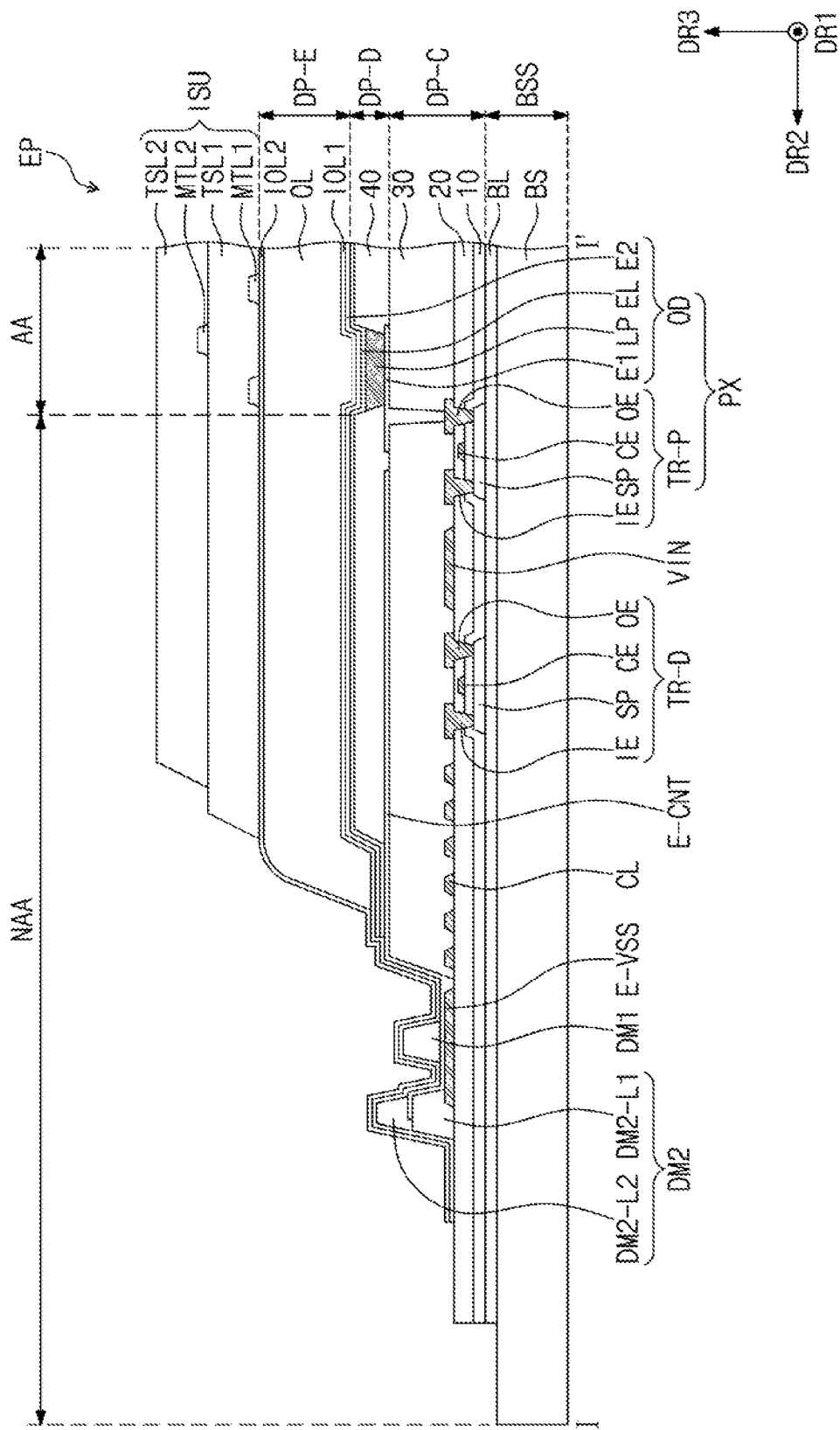
FIG. 5 is a cross-sectional view taken along a line I-I' in FIG. 2.

FIG. 5 is a cross-sectional view taken along a line I-I' in FIG. 2.

Referring to FIG. 5, according to an embodiment, the display panel EP includes a base substrate BSS, a circuit layer DP-C, a display element layer DP-D, a sealing layer DP-E, and an input detection unit ISU. The circuit layer DP-C and the display element layer DP-D include the components of the pixel PX described with reference to FIG. 4.

According to an embodiment, the pixel PX is disposed in the active area AA. The pixel PX generates light to display the above-described image IM. A plurality of pixels PX are disposed in the active area AA.

According to an embodiment, FIG. 5 shows a thin film transistor TR-P, hereinafter referred to as a pixel transistor, and an organic light emitting diode OD of the pixel PX. The pixel transistor TR-P corresponds to the driving transistor T1 shown in FIG. 4.

According to an embodiment, the pixel transistor TR-P forms the circuit layer DP-C together with the first to third insulating layers 10, 20, and 30 of a plurality of insulating layers. Each of the first to third insulating layers 10, 20, and 30 may include an organic material or an inorganic material, and may have a single layer or a laminated structure. The circuit layer DP-C is disposed on the base substrate BSS.

According to an embodiment, the base substrate BSS includes a base layer BS and an auxiliary layer BL. The base layer BS is an insulating substrate. The base layer BS may be flexible. For example, the base layer BS includes a polyimide (PI). Alternatively, the base layer BS may be rigid. For example, the base layer BS is formed of various materials such as glass or plastic, and is not limited to any one embodiment.

According to an embodiment, the auxiliary layer BL is disposed on the base layer BS. The auxiliary layer BL is formed directly on the base layer BS to cover the front surface of the base layer BS. Accordingly, the front surface of the auxiliary layer BL faces the front surface of the base substrate BSS, and the back surface of the base layer BS faces the back surface of the base substrate BSS.

According to an embodiment, the auxiliary layer BL includes an inorganic material. The auxiliary layer BL includes a barrier layer or a buffer layer. Accordingly, the auxiliary layer BL prevents oxygen or water seeping through the base layer BS from penetrating the circuit layer DP-C or the display element layer DP-D, or reduces the surface energy of the base substrate BSS such that the circuit layer DP-C is stably formed on the base substrate BSS.

In addition, according to an embodiment, in relation to the base substrate BSS, at least one of the base layer BS or the auxiliary layer BL includes a plurality of layers that are alternately stacked with each other. Alternatively, at least one of the barrier layer and the buffer layer of the auxiliary layer BL may include a plurality of layers, or may be omitted. However, these are non-limiting examples, and the base substrate BSS according to an embodiment of the inventive concept may include various embodiments and is not limited to any one embodiment.

According to an embodiment, the pixel transistor TR-P includes a semiconductor pattern SP, a control electrode CE, an input electrode IE, and an output electrode OE. The semiconductor pattern SP is disposed on the base substrate BSS. The semiconductor pattern SP includes a semiconductor material. The control electrode CE is spaced apart from the semiconductor pattern SP with the first insulating layer 10 therebetween. The control electrode CE is connected to the first thin film transistor T1 and one electrode of the capacitor Cst.

According to an embodiment, the input electrode IE and the output electrode OE are spaced apart from the control electrode CE with the second insulating layer 20 therebetween. The input electrode IE and the output electrode OE of the pixel transistor TR-P pass through the first insulating layer 10 and the second insulating layer 20 and are electrically connected to opposite sides of the semiconductor pattern SP, respectively.

According to an embodiment, the third insulating layer 30 is disposed on the second insulating layer 20 and covers the input electrode IE and the output electrode OE. On the other hand, in the pixel transistor TR-P, the semiconductor pattern SP may be disposed on the control electrode CE. Alternatively, the semiconductor pattern SP may be disposed on the input electrode IE and the output electrode OE. Alternatively, the input electrode IE and the output electrode OE may be disposed on the same layer as the semiconductor pattern SP and directly connected to the semiconductor pattern SP. The pixel transistor TR-P according to an embodiment of the inventive concept may have one of various structures, and is not limited to any one embodiment.

According to an embodiment, an organic light emitting diode OD is disposed on the circuit layer DP-C. The organic light emitting diode OD forms the display element layer DP-D together with a fourth insulating layer 40 of the plurality of insulating layers. The organic light emitting diode OD includes a first electrode E1, a light-emission pattern LP, a control layer EL, and a second electrode E2. The fourth insulating layer 40 may include an organic material or an inorganic material, and may have a single layer or a laminated structure.

According to an embodiment, the first electrode E1 is connected to the pixel transistor TR-P through the third insulating layer 30. Moreover, the display panel 100 may further include a separate connection electrode disposed between the first electrode E1 and the pixel transistor TR-P, and the first electrode E1 may be electrically connected to the pixel transistor TR-P through the connection electrode.

According to an embodiment, the fourth insulation layer 40 is disposed on the third insulation layer 30. An opening is formed in the fourth insulating layer 40. The opening exposes at least a part of the first electrode E1. The fourth insulating layer 40 is a pixel definition layer.

According to an embodiment, the light-emission pattern LP is disposed in the opening and on the first electrode E1 exposed by the opening. The light-emission pattern LP includes a light emitting material. For example, the light-emission pattern LP includes at least one material that emits red, green, or blue light, and may include a fluorescent material or a phosphorescent material. The light-emission pattern LP may include an organic light emitting material or an inorganic light emitting material. The light-emission pattern LP emits light in response to a potential difference between the first electrode E1 and the second electrode E2.

According to an embodiment, the control layer EL is disposed between the first electrode E1 and the second electrode E2. The control layer EL is disposed adjacent to the light-emission pattern LP. The control layer EL controls the charge transfer to improve the light-emission efficiency and lifetime of the organic light emitting diode OD. The control layer EL includes at least one of a hole transporting material, a hole injecting material, an electron transporting material, or an electron injecting material.

In an embodiment, FIG. 5 shows the control layer EL as being disposed between the light-emission pattern LP and the second electrode E2. However, this is an example, and embodiments are not limited thereto. The control layer EL may be disposed between the light-emission pattern LP and the first electrode E1, or may include a plurality of layers stacked along the third direction DR3 with the light-emission pattern LP therebetween.

According to an embodiment, the control layer EL has an integral shape that extends from the active area AA to the peripheral area NAA. The control layer EL is commonly provided to a plurality of pixels.

According to an embodiment, the second electrode E2 is disposed on the light-emission pattern LP. The second electrode E2 is opposed to the first electrode E1. The second electrode E2 has an integral shape that extends from the active area AA to the peripheral area NAA The second electrode E2 is commonly provided to a plurality of pixels. Each of the organic light emitting diodes OD disposed in each of the pixels receives a common power voltage, hereinafter referred to as a second power voltage, through the second electrode E2.

According to an embodiment, the second electrode E2 may include a transmissive conductive material or a transflective conductive material. Accordingly, light generated in the light-emission pattern LP is emitted in the third direction DR3 through the second electrode E2. But, this is an example. According to an embodiment, the organic light emitting diode OD may be driven in a back surface light-emission system in which the first electrode E1 includes a transparent or semi-transparent material, or may be driven in a double-sided light-emission system in which light is emitted towards both front and back surfaces, and the organic light emitting diode OD is not limited to any one embodiment.

According to an embodiment, the scaling layer DP-E is placed on the organic light emitting diode OD to seal the organic light emitting diode OD. The sealing layer DP-E has an integral shape that extends from the active area AA to the peripheral area NAA. The sealing layer DP-E is commonly provided to a plurality of pixels. In addition, a capping layer that covers the second electrode E2 may be further disposed between the second electrode E2 and the scaling layer DP-E.

According to an embodiment, the sealing layer DP-E includes a first inorganic layer IOL1, an organic layer OL, and a second inorganic layer IOL2 that are sequentially stacked along the third direction DR3. However, embodiments are not limited thereto, and the sealing layer EP-E may further include a plurality of inorganic layers and organic layers.

According to an embodiment, the first inorganic layer IOL1 covers the second electrode E2. The first inorganic layer IOL1 can prevent external moisture or oxygen from penetrating into the organic light emitting diode OD. For example, the first inorganic layer IOL1 may include silicon nitride, silicon oxide, or a combination thereof. The first inorganic layer IOL1 is formed through a deposition process.

According to an embodiment, the organic layer OL is disposed on the first inorganic layer IOL1 and contacts the first inorganic layer IOL1. The organic layer OL provides a flat surface on the first inorganic layer IOL1. The organic layer covers a recess formed on an upper surface of the first inorganic layer IOL1 and any particles present on the first inorganic layer IOL1, to prevent the surface state of rite upper surface of the first inorganic layer IOL1 from influencing structures formed on the organic layer OL. Further, the organic layer OL relieves stress between the contacting layers. The organic layer OL includes an organic material, and is formed through a solution process such as a spin coating process, a slit coating process, or an ink jet process.

According to an embodiment, the second inorganic layer IOL2 is disposed on the organic layer OL and covers the organic layer OL. The second inorganic layer IOL2 is stably formed on the relatively flat surface provided by the organic layer OL. The second inorganic layer IOL2 seals moisture or other substances emitted from the organic layer OL to prevent them from being emitted outside. The second inorganic layer IOL2 may include silicon nitride, silicon oxide, or a combination thereof. The second inorganic layer IOL1 is formed through a deposition process.

According to an embodiment, the input detection unit ISU includes a first conductive layer MTL1, a second conductive layer MTL2, a first touch insulating layer TSL1, and a second touch insulating layer TSL2.

According to an embodiment, the first conductive layer MTL1 is disposed on the sealing layer DP-E.

According to an embodiment, the first conductive layer MTL1 includes a conductive material. For example, the first conductive layer MTL1 includes at least one of a metal, a transparent conductive oxide, or a conductive polymer. The first conductive layer MTL1 may have a plurality of layers, but is not limited thereto.

According to an embodiment, the first touch insulating layer TSL1 is disposed on the first conductive layer MTL1 and covers the first conductive layer MTL1.

According to an embodiment, the second conductive layer TSL2 is disposed on the first touch insulating layer TSL1. The second conductive layer MTL2 includes at least one of a metal, a transparent conductive oxide, or a conductive polymer. The second conductive layer MTL2 may have a plurality of layers, but is not limited thereto.

In an embodiment, the second conductive layer MTL2 is electrically connected to the first conductive layer MTL1 through a contact hole that penetrates the first touch insulating layer TSL1 in a certain region. The input detection unit ISU has a touch line shape formed by the first conductive layer MTL1 and the second conductive layer TSL2 that will be described below.

According to an embodiment, the second touch insulating layer TSL2 is disposed on the second conductive layer MTL2 and covers the second conductive layer MTL2.

In addition, the display panel EP according to an embodiment of the inventive concept includes a thin film transistor TR-D, hereinafter referred to as a driving transistor, a plurality of signal patterns E-VSS, E-CNT, VIN, and CL, and a plurality of dam parts DM1 and DM2 in the peripheral area NAA. The control transistor TR-D and the signal patterns E-VSS. E-CNT, VIN and CL are part of the circuit layer DP-C.

According to an embodiment, FIG. 5 shows the control transistor TR-D as having a structure corresponding to the pixel transistor TR-P. For example, the control transistor TR-D includes a semiconductor pattern SP disposed on the base substrate BSS, a control electrode CE disposed on the first insulating layer 10, and an input electrode IE and an output electrode OE disposed on the second insulating layer 20. Thus, the pixel transistor TR-P and the control transistor TR-D can be simultaneously formed in the same process, thereby simplifying the process and reducing the process cost. However, this is an example, and the control transistor TR-D according to an embodiment of the inventive concept may have a different structure from that of the pixel transistor TR-P, and is not limited to any one embodiment.

According to an embodiment, the signal patterns E-VSS, E-CNT, VIN and CL include a power supply line E-VSS, a connection electrode E-CNT, an initialization voltage line VIN, and a driving signal line CL. The power supply line E-VSS corresponds to the power terminal ELVSS of the pixel PX. Accordingly, the power supply line E-VSS supplies the second power voltage to the organic light emitting diode OD. In an embodiment, the second power voltages are a common voltage supplied to all of the pixels PX.

According to an embodiment, the power supply line E-VSS is disposed on the second insulating layer 20 as part of the circuit layer DP-C. The power supply line E-VSS are simultaneously formed in a same process as the input electrode IE and the output electrode OE of the control transistor TR-D. However, this is an example. In other embodiments, the power supply line E-VSS is formed on a different layer from the input electrode IE and the output electrode OE of the control transistor TR-D through a separate process, and is not limited to any one embodiment.

According to an embodiment, the connection electrode E-CNT is disposed on the third insulating layer 30 as part of the display element layer DP-D. The connection electrode E-CNT is electrically connected to the power supply line E-VSS. The connection electrode E-CNT extends from the third insulating layer 30 and covers the upper surface of the power supply line E-VSS exposed by the third insulating layer 30.

According to an embodiment, the second electrode E2 of the organic light emitting diode OD extends from the active area AA and connects to the connection electrode E-CNT. The connection electrode E-CNT receives the second power voltage from the power supply line E-VSS. Accordingly, the second power voltage is transmitted to the second electrode E2 through the connection electrode E-CNT, and is provided for each pixel.

According to an embodiment, the connection electrode E-CNT is formed on the some layer as the first electrode E1 of the organic light emitting diode OD and is simultaneously formed with the first electrode E1. However, this is an example, and the connection electrode E-CNT may be disposed on a different layer from the first electrode E1.

According to an embodiment, the driving signal lines CL include a plurality of lines and are disposed on the second insulating layer 20. The driving signal lines CL are disposed in the peripheral area NAA. The driving signal lines CL may be a routing wiring connected to a pad, or may be part of an integrated circuit IC. The driving signal lines CL are spaced apart from each other in the second direction DR2 and independently transmit electrical signals.

According to an embodiment, the initialization voltage line VIN is disposed in the peripheral area NAA to provide the initialization voltage to the pixel PX. In addition, a plurality of initialization voltage lines VIN are provided to transmit an initialization voltage to each of the plurality of pixels.

According to an embodiment, the driving signal lines CL and the initialization voltage line VIN are disposed on the same layer and simultaneously formed through the same process. However, this is an example, and the driving signal line CL and the initialization voltage line VIN may be independently formed through separate processes and are not limited to any one embodiment.

According to an embodiment, the dam parts DM1 and DM2 are disposed in the peripheral area NAA. Upon formation of the organic layer OL of the sealing layer DP-E, the dam parts DM1 and DM2 prevent the organic layer OL from flowing out from the active area AA in the second direction DR2 toward the edge of the display panel HP. The dam parts DM1 and DM2 are disposed adjacent to at least one side of the active area AA. The dam parts DM1 and DM2 surround the active area AA on a plane. The dam parts DM1 and DM2 include a first dam part DM1 and a second dam pan DM2.

According to an embodiment, the first dam part DM1 is disposed closer to the active area AA than the second dam part DM2. The first dam pan DM1 overlaps the power supply line E-VSS. In an embodiment, the connection electrode E-CNT crosses between the first dam part DM1 and the power supply line E-VSS on a cross section.

In an embodiment, the first dam part DM1 includes the same material as the fourth insulating layer 40, and is simultaneously formed with the fourth insulating layer 40 through one mask. Accordingly, a separate process for forming the first dam part DM1 may be omitted, which simplifies the process and reduces the process cost.

According to an embodiment, the second dam pan DM2 is disposed on the outer side of the first dam part DM1. The second dam pan DM2 covers a part of the power supply line E-VSS. In an embodiment, the second dam part DM2 has a multilayer structure that includes a first layer DM2-L1 and a second layer DM2-L2. The first layer DM2-L1 is formed at the same time as the third insulating layer 30, and the second layer DM2-L2 is formed at the same time as the fourth insulating layer 40. Accordingly, the second dam pan DM2 can be easily formed without an additional process.

In an embodiment, the connection electrode E-CNT partially overlaps the first layer DM2-L1 of the second dam part DM2. The end of the connection electrode E-CNT is inserted between the first layer DM2-L1 and the second layer DM2-L2. However, this is an example, and the connection electrode E-CNT may not extend to the second dam part DM2, and is not limited to any one embodiment.

According to an embodiment, the first inorganic layer IOL1 and the second inorganic layer IOL2 extend from the active area AA past the second dam part DM2 The first inorganic layer IOL1 and the second inorganic layer IOL2 cover the first dam part DM1 and the second dam part DM2. The organic layer OL is disposed inward from the second dam part DM2. However, this is an example, and the organic layer OL may extend to an area overlapping the first dam part DM1, and is not limited to any one embodiment.

Figure 6:
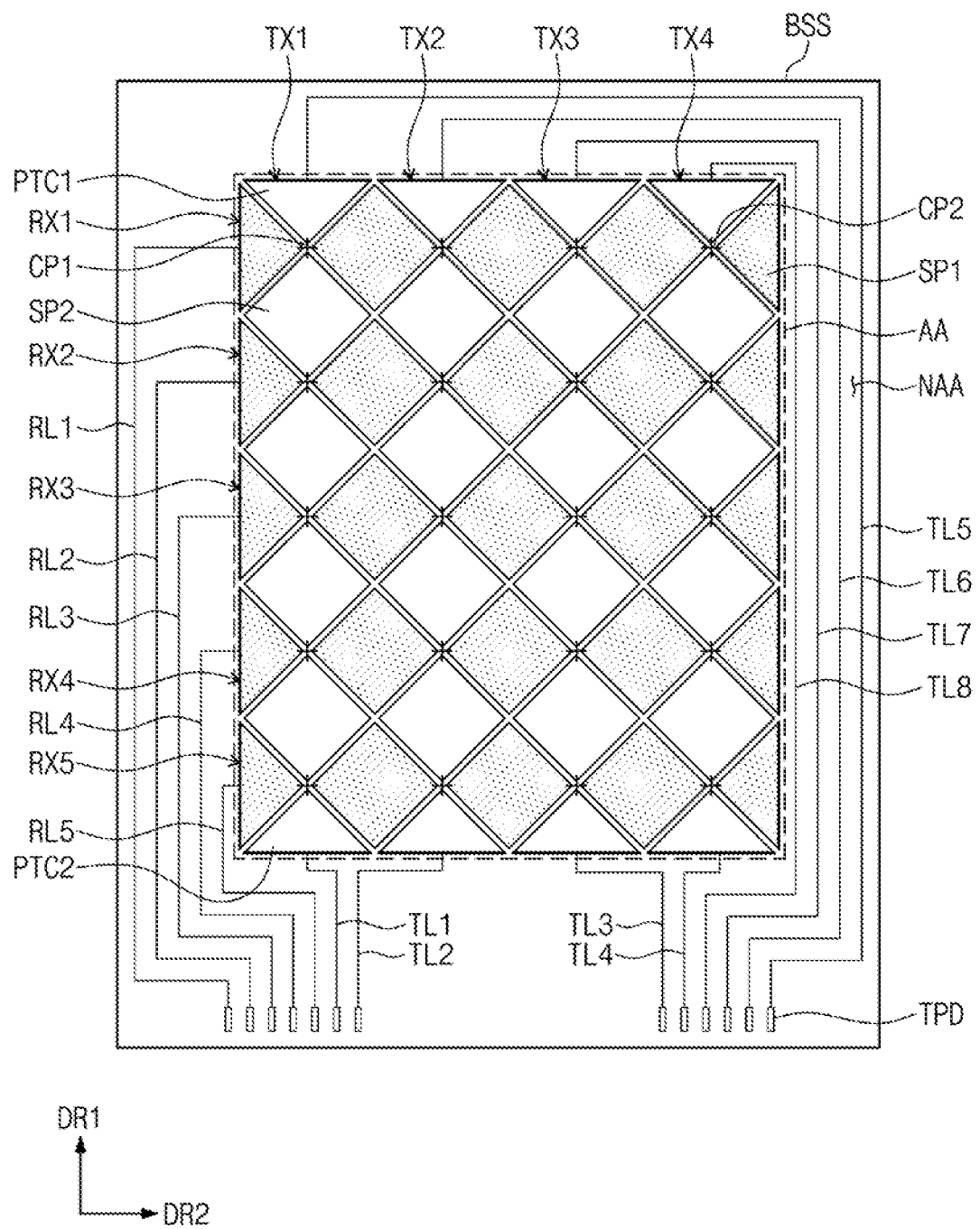
FIG. 6 is a plan view of an input detection unit and a base substrate of FIG. 3.

FIG. 6 is a plan view of the input detection unit and the base substrate of FIG. 3.

According to an embodiment, the input detection unit ISU can implemented with a capacitor. The input detection unit ISU operates through at least one of a method of extracting touch coordinates based on capacitance change of capacitors formed by two kinds of touch lines insulated from each other and that extend in different directions, and a method of extracting touch coordinates based on the capacitance change of capacitors formed by a plurality of touch electrodes disposed in an active area. For clarity of exposition, an embodiment below of the input detection unit ISU is described with reference to the former method.

According to an embodiment, the input detection unit ISU detects a touch input in the active area AA and does not detect a touch input in the peripheral area NAA.

According to an embodiment, the input detection unit ISU includes sensing touch lines RX1 to RX5, transmission touch lines TX1 to TX4, sensing lines RL1 to RL5, transmission lines TL1 to TL8, and touch pads TPD.

According to an embodiment, the sensing touch lines RX1 to RX5 and the transmission touch lines TX1 to TX4 are spaced from each other.

According to an embodiment, the transmission touch lines TX1 to TX4 is insulated from and intersect the sensing touch lines RX1 to RX5. Each of the transmission touch lines TX1 to TX4 includes a plurality of transmission touch sensor units SP1 and a plurality of first connection parts CP1. The transmission touch sensor units SP1 are arranged along the first direction DR1. Each of the first connection parts CP1 connects the two adjacent transmission touch sensor units SP1. Each of the transmission touch sensor units SP1 has a mesh shape that has openings therein.

According to an embodiment, each of the sensing touch lines RX1 to RX5 includes a plurality of sensing touch sensor units SP2 and a plurality of second connection parts CP2. The sensing touch sensor units SP2 are arranged along the second direction DR2. Each of the second connection parts CP2 connects the two adjacent sensing touch sensor units SP2SP2. Each of the sensing touch sensor units SP2 has a mesh shape that has openings therein.

In an embodiment of the inventive concept, the sensing touch sensor units SP2, the second connection parts CP2 and the transmission touch sensor units SP1 are included in the first conductive layer MTL1 described with reference to FIG. 5, and the first connection parts CP1 are included in the second conductive layer MTL2 described with reference to FIG. 5. According to an embodiment, the first connection parts CP1 are connected to the adjacent transmission touch sensor units SP1 through contact holes formed in the first touch insulation layer TSL1. However, embodiments are not limited thereto. In another embodiment of the inventive concept, the sensing touch sensor units SP2, the second connection parts CP2 and the transmission touch sensor units SP1 are included in the second conductive layer MTL2 described with reference to FIG. 5, and the first connection parts CP1 are included in the first conductive layer MTL1 described with reference to FIG. 5.

According to an embodiment, the sensing touch lines RX1 to RX5 and the transmission touch lines TX1 to TX4 form a touch capacitor. The input detection unit ISU detects touch input coordinates based on the amount of change in the touch capacitors.

According to an embodiment, one end of each of the sensing lines RL1 to RL5 is connected to one end of each of the sensing touch lines RX1 to RX5. The other ends of the sensing lines RL1 to RL5 are connected to the touch pads TPD. The sensing lines RL1 to RL5 transmit sensing signals received from the sensing touch lines RX1 to RX5 to a touch driver chip through the touch pads TPD.

According to an embodiment, one end of each of the first to fourth transmission lines TL1 to TL4 of the transmission lines TL1 to TL8 is connected to one end of each of the transmission touch lines TX1 to TX4. The other ends of the first to fourth transmission lines TL1 to TL4 may be connected to the touch pads TPD. One end of each of the fifth to eighth transmission lines TL5 to TL8 of the transmission lines TL1 to TL8 is connected to the other end of each of the transmission touch lines TX1 to TX4. The other ends of the fifth to eighth transmission lines TL5 to TL8 are connected to the touch pads TPD. A first outer transmission touch sensor unit PTC1 included in the first transmission touch line TX1 and disposed at the outermost position in the first direction DR1 is connected to the fifth transmission line TL5. A second outer transmission touch sensor unit PTC2 included in the first transmission touch line TX1 and disposed at the outermost position in the direction opposite to the first direction DR1 is connected to the first transmission line TL1.

According to an embodiment, the transmission lines TL1 to TL8 transmit a touch driving signal received from the touch driving chip to the transmission touch lines TX1 to TX4 through the touch pads TPD.

According to an embodiment, the number of sensing lines RL1 to RL5 is equal to the number of sensing touch lines RX1 to RX5 and the number of transmission lines TL1 to TL8 is greater than the number of transmission touch lines TX1 to TX4.

In an embodiment of the inventive concept, the display panel EP (see FIG. 2) has a rectangular shape on a plane. Therefore, the base substrate BSS has a long side extending in the first direction DR1 and a short side extending in the second direction DR2.

According to an embodiment, each of the transmission touch lines TX1 to TX4 is longer than each of the sensing touch lines RX1 to RX5. In order to mitigate a delay phenomenon of the signal due to differences in resistance values based on length differences of the transmission touch lines TX1 to TX4 and the sensing touch lines RX1 to RX5, the transmission lines TL1 to TL8 are connected to both ends of transmission touch lines TX1 to TX4, and the sensing lines RL1 to RL5 are connected to one end of each of the sensing touch lines RX1 to RX5.

Figure 7:
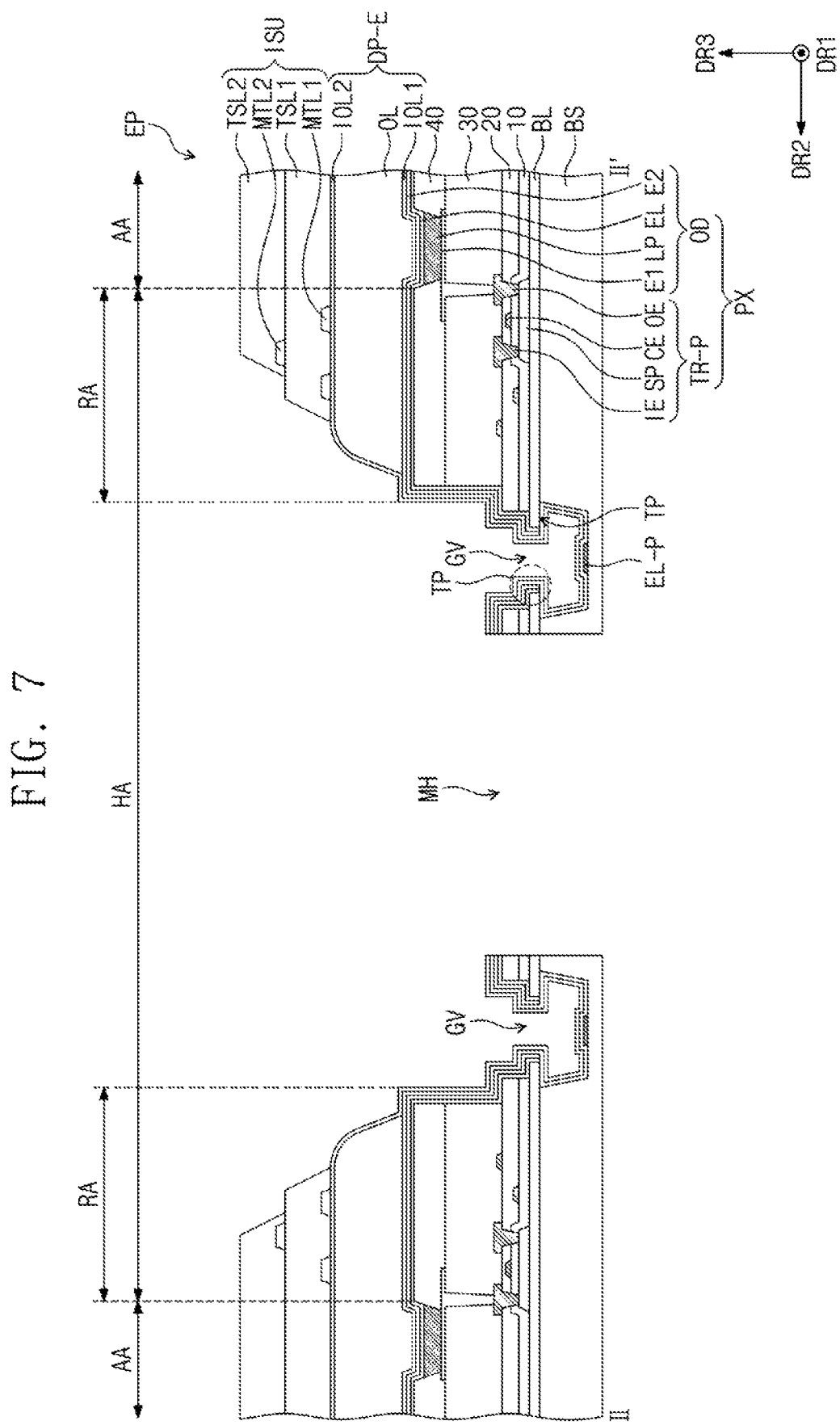
FIG. 7 is a cross-sectional view taken along a line II-II' in FIG. 2.
Figure 8:
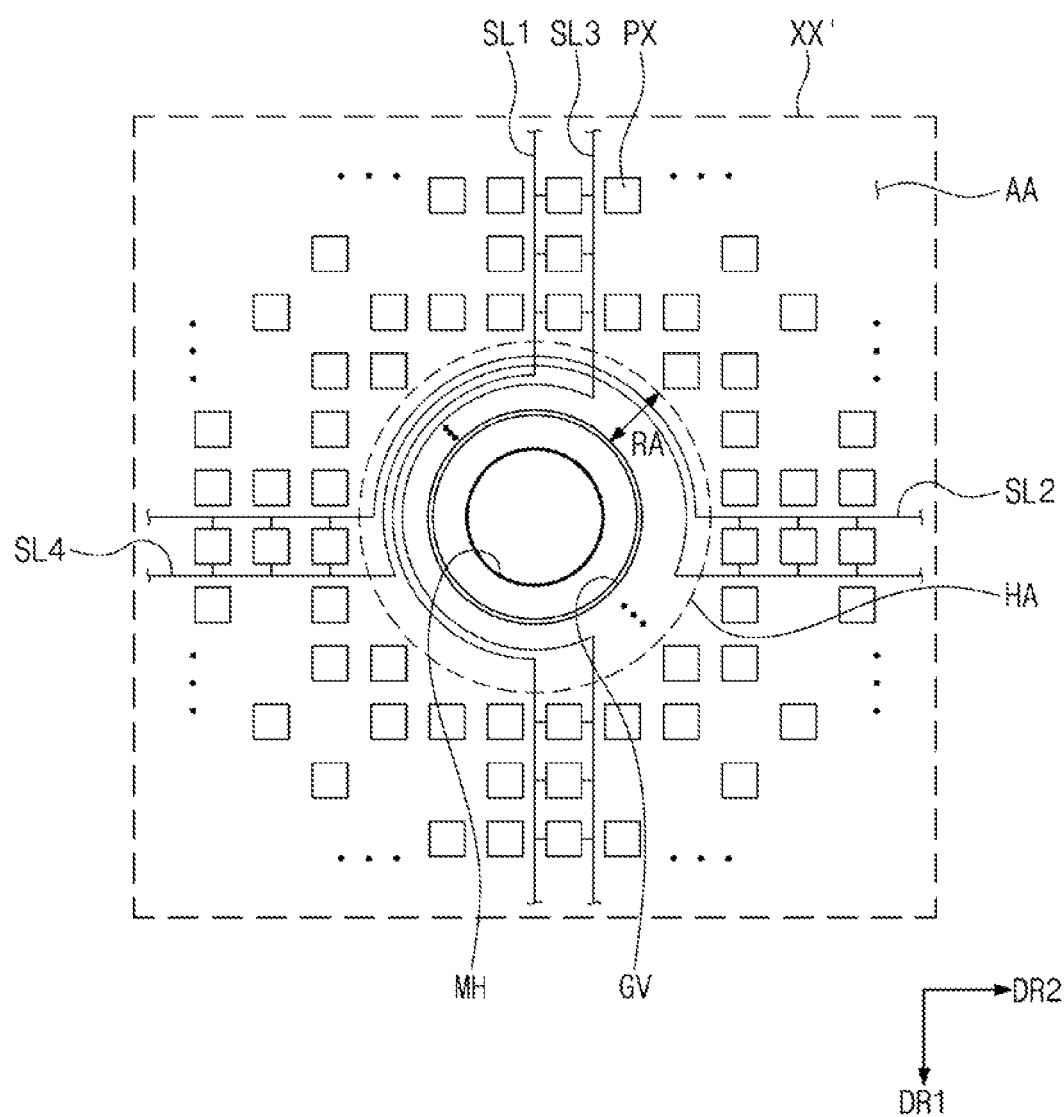
FIGS. 8 and 9 are plan views of an area XX' in FIG. 2.
Figure 9:
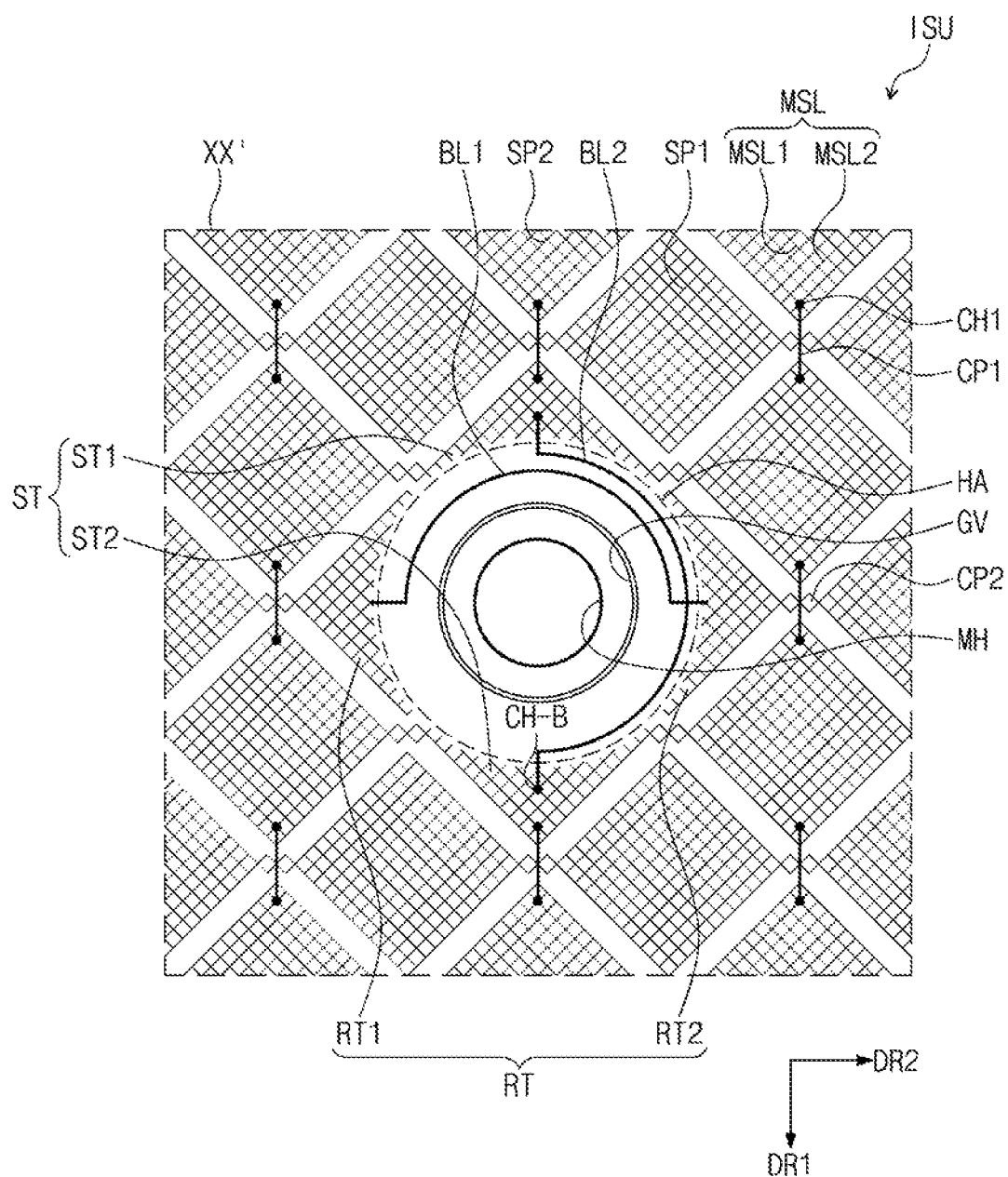

FIG. 7 is a cross-sectional view taken along a line II-II′ in FIG. 2. FIGS. 8 and 9 are plan views of an area XX′ in FIG. 2. FIG. 7 substantially corresponds to the cross-sectional view of the area XX′. On the other hand, in FIGS. 8 and 9, not all components of the display panel EP are shown. Specifically, FIG. 8 shows some of the pixels PX and signal lines, and FIG. 9 shows an input detection unit ISU (see FIG. 6). Hereinafter, embodiments of the inventive concept will be described with reference to FIGS. 7 to 9.

According to an embodiment, the hole area HA is surrounded on the plane by the active area AA. In FIGS. 7 and 8, the hole area HA is shown by dotted lines for ease of illustration. The pixels PX are spaced apart from the module hole MH and some of the pixels PX disposed adjacent to the hole area HA are disposed along the edge of the hole area HA.

Referring to FIG. 7, according to an embodiment, the module hole MH is formed in the hole area HA. The module hole MH is formed at the center of the hole area HA. The module hole MH is a through hole that penetrates through the display panel EP. The module hole MH penetrates the front surface and the back surface of the base substrate BSS. Specifically, the module hole MH penetrates the structures disposed in the hole area HA of the layers disposed on the front surface of the base substrate BSS. Thus, the first insulating layer 10 extending to the hole area HA, the second insulating layer 20, the third insulating layer 30, the control layer EL, the first inorganic layer IOL1, and the second inorganic layer IOL2 are penetrated to form the side surface of the module hole MH.

In addition, the display panel EP according to a present embodiment further include a depression pattern GV formed in the hole area HA. The depression pattern GV is formed along the edge of the module hole MH. In a present embodiment, the depression pattern GV is shown in FIG. 8 as a closed circle that surrounds the module hole MH and has a shape similar to the shape of the module hole MH. But, this is an example. The depression pattern GV may have a shape that differs from that of the module hole MH, such as a polygon, an ellipse, or a closed curve that includes at least a part of a circle, or have a shape that includes a plurality of partially disconnected patterns, but the shape of the depression pattern GV is not limited to any one embodiment.

According to an embodiment, the depression pattern GV is formed by removing some of the components of the display panel EP to form a depressed pattern in the front surface of the display panel EP. On the other hand, unlike the module hole MH, the depression pattern GV does not penetrate through the display panel EP. Accordingly, the back surface of the base substrate BSS overlaps the depression pattern GV and is not opened by the depression pattern GV.

According to an embodiment, the depression pattern GV penetrates into the base layer BS and penetrates through the remaining components. In an embodiment, the depression pattern GV is formed by connecting a through pan formed in the auxiliary layer BL and a depression part formed in the base layer BS. The inner surface of the depression pattern GV is covered by the first inorganic layer IOL1 and the second inorganic layer IOL2.

On the other hand, according to an embodiment, the depression pattern GV has an undercut shape that includes a tip part TP that protrudes inwards. In an embodiment, the tip pan TP is a pan of the auxiliary layer BL more protrudes further toward the other side of the depression pattern GV than the base layer BS. On the other hand, if the tip part TP is formed in the depression pattern GV, the display panel EP according to an embodiment of the inventive concept may have various layer structures and is not limited to any one embodiment.

According to an embodiment, the display panel EP further includes a predetermined organic pattern EL-P disposed in the depression pattern GV. The organic pattern EL-P includes the same material as the control layer EL. Alternatively, the organic pattern EL-P further includes the same material as the second electrode E2. The organic pattern EL-P may have a single layer or multilayer structure.

According to an embodiment, the organic pattern EL-P is disposed within the depression pattern GV being spaced away from the control layer EL and the second electrode E2. It is covered by the first inorganic layer IOL1 and is not externally exposed.

According to embodiment, the depression pattern GV breaks the continuity of the control layer EL that extends from the side surface of the module hole MH to the active area AA. The control layer EL is disconnected in an area that overlaps the depression pattern GV. The control layer EL can be a path for movement of external pollution such as moisture or air. Moisture or air can be introduced through a path that extends from the layer exposed by the module hole MH, such as the control layer EL, passes through the hole area HA and enters the active area AA. This path is blocked by the depression pattern GV. Thus, the reliability of the display panel EP having a module hole MH can be improved.

In addition, in the display panel EP according to an embodiment of the inventive concept, a plurality of depression patterns GV may be provided spaced apart from each other along the radial direction with respect to a center of the module hole, and a portion of the organic layer OL extends to fill a portion of the depression patterns GV. Alternatively, in the display panel EP according to an embodiment of the inventive concept, the depression pattern GV may be omitted, and is not limited to any one embodiment.

According to an embodiment, as described above, the pixels PX and the input detection unit ISU are disposed spaced apart from the module hole MH on a plane. Hereinafter, the module hole MH and the pixels PX and the input detection unit ISU around the module hole MH will be described with reference to FIGS. 8 and 9.

Referring again to FIG. 7, according to an embodiment, a routing area RA is further defined in the hole area HA. The routing area RA is outside the module hole MH. Specifically, the routing area RA is outside the depression pattern GV. The routing area RA surrounds the module hole MH and the depression pattern GV.

Referring to FIG. 8, according to an embodiment, the pixels PX are arranged surrounding the hole area HA. Some of the pixels PX are arranged along the edge of the hole area HA. The pixels PX are spaced apart on a plane from the module hole MH.

According to an embodiment, a plurality of signal lines SL1, SL2, SL3, and SL4 connected to the pixels PX are disposed in the hole area HA. The signal lines SL1, SL2, SL3 and SL4 are connected to the pixels PX through the routing area RA For ease of illustration. FIG. 8 shows a first signal line SL1, a second signal line SL2, a third signal line SL3, and a fourth signal line SL4 of the plurality of signal lines connected to the pixels PX.

According to an embodiment, in the active area AA, the first signal line SL1 extends along the first direction DR1. The first signal line SL1 is connected to pixels PX in the same column arranged along the first direction DR1. The first signal line SL1 corresponds to the data line 16 (see FIG. 4).

According to an embodiment, in the routing area RA, the first signal line SL1 has a curved shape. FIG. 8 shows the first signal line SL1 as forming a semicircle in the routing area RA along an outline of the module hole MH and the depression pattern GV.

According to an embodiment, some of the pixels connected to the first signal line SL1 are arranged on an upper side of the module hole MH and other pixels are arranged on a lower side of the module hole MH. Accordingly, even if some pixels around the module hole MH are omitted, the pixels in the same column connected to the first signal line SL1 receive the data signal through the same line.

According to an embodiment, in the active area AA, the second signal line SL2 extends along the second direction DR2. The second signal line SL2 is connected to pixels PX in the same row arranged along the second direction DR2 The second signal line SL2 corresponds to the gate line 14 (see FIG. 4).

According to an embodiment, in the routing area RA, the second signal line SL2 has a curved shape. FIG. 8 shows that the second signal line SL1 as forming a semicircle in the routing area RA along an outline of the module hole MH and the depression pattern GV.

In a routing area RA some of the pixels connected to the second signal line SL2 are arranged on the left side of the module hole MH and the other pixels are arranged on the right side of the module hole MH. Accordingly, even if some of the pixels around the module hole are omitted, the pixels in the same row connected to the second signal line SL2 are turned on/off by substantially the same gate signal. In addition, the display panel EP according to an embodiment of the inventive concept further includes a connection pattern arranged in the routing area RA. According to an embodiment, the first signal line SL1 is disconnected in an area that overlaps the hole area HA. The disconnected portions of the first signal line SL1 are connected through a connection pattern. According to an embodiment, the connection pattern is disposed on a different layer from the first signal line SL1, and is connected to the first signal line SL1 through a contact hole. Similarly, the second signal line SL2 is disconnected in the area that overlaps the hole area HA, and a connection patient is provided that connects the disconnected portions of the second signal line SL2. According to an embodiment, the connection pattern is disposed on a different layer from the second signal line SL2, and is connected to the second signal line SL2 through the contact hole.

According to an embodiment, in the active area AA, the third signal line SL3 extends along the first direction DR1 and the fourth signal line SL4 extends along the second direction DR2. The third signal line SL3 is spaced apart from the first signal line SL1 and the fourth signal line SL4 is spaced apart from the second signal line SL2.

In the routing area RA, according to an embodiment, the third signal line SL3 and the fourth signal line SL4 have a curved shape. FIG. 8 shows that the third signal line SL3 and the fourth signal line SL4 form a semicircle in the routing area RA along the outline of the module hole MH and the depression pattern GV.

According to an embodiment, each of the third signal line SL3 and the fourth signal line SL4 may be any one of the light-emission line 15, the power line 26, or the initialization voltage line 22 described with reference to FIG. 4.

Referring to FIG. 9, according to an embodiment, the sensing touch sensor units SP2 and the transmission touch sensor units SP1 are spaced apart from each other.

According to an embodiment, each of the sensing touch sensor units SP2 and the transmission touch sensor units SP1 include a plurality of mesh lines MSL that intersect the first direction DR1 and the second direction DR2. The mesh lines MSL include a first mesh line MSL1 that extends in one direction and a second mesh line MSL2 that extends in a direction that intersects the first mesh line MSL1. The first and second mesh lines MSL1 and MSL2 are connected to form net-shaped sensing touch sensor units SP2 and transmission touch sensor units SP1.

According to an embodiment, the second connection parts CP2 extend along the second direction DR2. The second connection parts CP2 connect two adjacent sensing touch sensor units SP2 along the second direction DR2. The second connection parts CP2 are composed of a first mesh line MSL1 and a second mesh line MSL2.

According to an embodiment, the first connection parts CP1 extend along the first direction DR1. The first connection parts CP1 connect two adjacent transmission touch sensor units SP1 along the first direction DR1. The first connection parts CP1 may have a bar shape or may be composed of a first mesh line MSL1 and a second mesh line MSL2.

On the other hand, in an embodiment, as described with reference to FIG. 4, the sensing touch sensor units SP2, the transmission touch sensor units SP1, and the second connection parts CP2 are disposed on the same layer, and the first connection parts CP1 are disposed on another layer. Since the second connection parts CP2 and the first connection parts CP1 are disposed on different layers, they can be electrically insulated even if they intersect each other on a plane. The second connection parts CP2 are directly connected to the sensing touch sensor units SP2 and the first connection parts CP1 are connected to the transmission touch sensor units SP1 through the contact hole CH1.

In addition, in a present embodiment, some of the sensing touch sensor units SP2 and the transmission touch sensor units SP1 are disconnected due to the module hole MH.

According to an embodiment, some of the transmission touch sensor units SP1 are separated into an upper portion and a lower portion around the module hole MH. Some of the transmission touch sensor units SP1 have a shape in which portions that overlap the hole area HA are removed. Those transmission touch sensor units SP1 adjacent to the hole area HA that have a partially removed shape form a transmission touch pattern ST. The transmission touch pattern ST includes a first transmission touch pattern ST1 disposed on one side of the hole area HA in the first direction DR1 and a second transmission touch pattern ST2 disposed on the other side of the hole area HA in the first direction DR1.

According to an embodiment, some of the sensing touch sensor units SP2 are separated into a left portion and a right portion around the module hole MH. Some of the sensing touch sensor units SP2 have a shape in which portions that overlap the hole area HA are removed. Those sensing touch sensor units SP2 adjacent to the hole area HA that have a partially removed shape form a sensing touch pattern RT. The sensing touch pattern RT includes a first sensing touch pattern RT1 disposed on one side of the hole area HA in the second direction DR2 and a second sensing touch pattern RT2 disposed on the other side of the hole area HA in the second direction DR2.

In the display panel EP according to an embodiment of the inventive concept, the input detection unit ISU further includes a second bridge line BL2 and a first bridge line BL1. The second bridge line BL2 and the first bridge line BL1 electrically connect the disconnected touch sensor units through the routing area RA. Specifically, the second bridge line BL2 connects the first sensing touch pattern RT1 and the second sensing touch pattern RT2, and the first bridge line BL1 connects the first transmission touch pattern ST1 and the second transmission touch pattern ST2.

According to an embodiment, the second bridge line BL2 and the first bridge line BL1 are arranged on different layers from each other. The second bridge line BL2 is disposed on the same layer as the sensing touch sensor units SP2, the second connection parts CP2, and the transmission touch sensor units SP1, and the first bridge line BL1 is disposed on the same layer as the first connection parts CP1. That is, the second bridge line BL2 is included in the first conductive layer MTL1 described with reference to FIG. 5, and the first bridge line BL1 is included in the second conductive layer MTL2 described with reference to FIG. 5.

According to an embodiment, second bridge fine BL2 is directly connected to the first sensing touch pattern RT1 and the second sensing touch pattern RT2, and the first bridge line BL1 is connected to the first transmission touch pattern ST1 and the second transmission touch patient ST2 through the contact holes CH-B. The contact hole CH-B is provided in the first touch insulating layer TSL1 of FIG. 5.

According to an embodiment, the second bridge line BL2 and the first bridge line BL1 are disposed in the routing area RA and overlap the bent portions of each of the first to fourth signal lines SL1 to SL4 described with reference to FIG. 8.

According to an embodiment, the second bridge line BL2 and the first bridge line BL1 are wider than the mesh lines MSL. Since the second bridge line BL2 and the first bridge line BL1 are relatively long as compared with the second connection parts CP2 and the first connection parts CP1, they are relatively wide to reduce resistance. However, embodiments of the inventive concept are not limited thereto, and the second bridge line BL2 and the first bridge line BL1 may be formed of the first mesh line MSL1 and the second mesh line MSL2.

The display panel EP according embodiments of to the inventive concept connects the pixels PX and the touch sensor units SP2 and SP1 spaced around the module hole MH through the signal lines SL1 and SL2 and the bridge lines BL1 and BL2 and facilitates electrical control of the pixels PX by maintaining an organic coupling between the pixels PX or the touch sensor units SP2 and SP1 spaced around the module hole MH. Thus, even if the module hole MH is formed in the active area AA, the display panel EP can provide stable driving of the active area AA.

Further, by arranging the bridge lines BL1 and BL2 in the routing area RA in the hole area HA, the image quality displayed by the pixels PX can be maintained and the bridge lines BL1 and BL2 are not externally visible, which can improve display quality.

Figure 10:
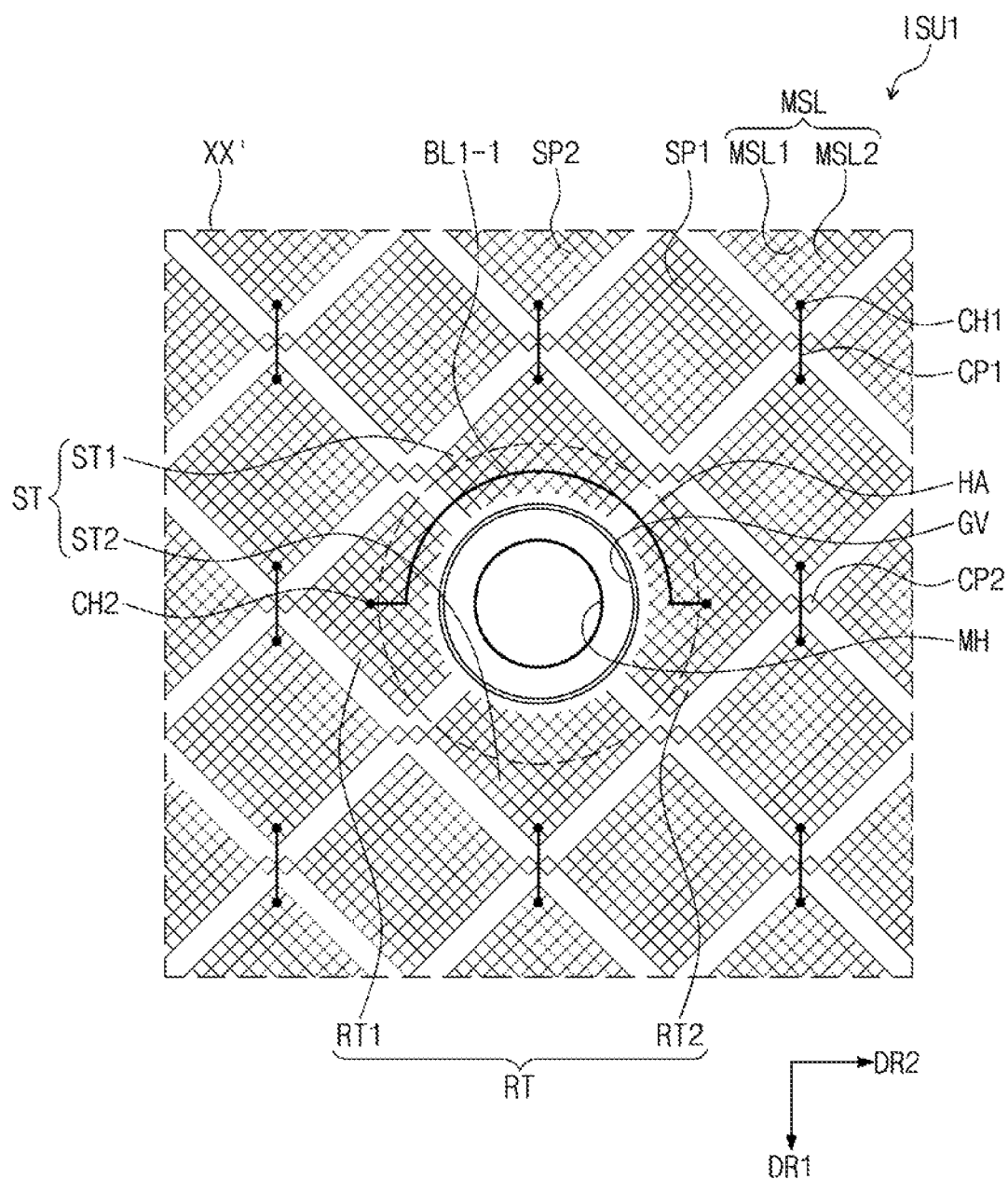
FIGS. 10 and 11 are plan views of a part of an input detection unit according to another embodiment of the inventive concept.
Figure 11:
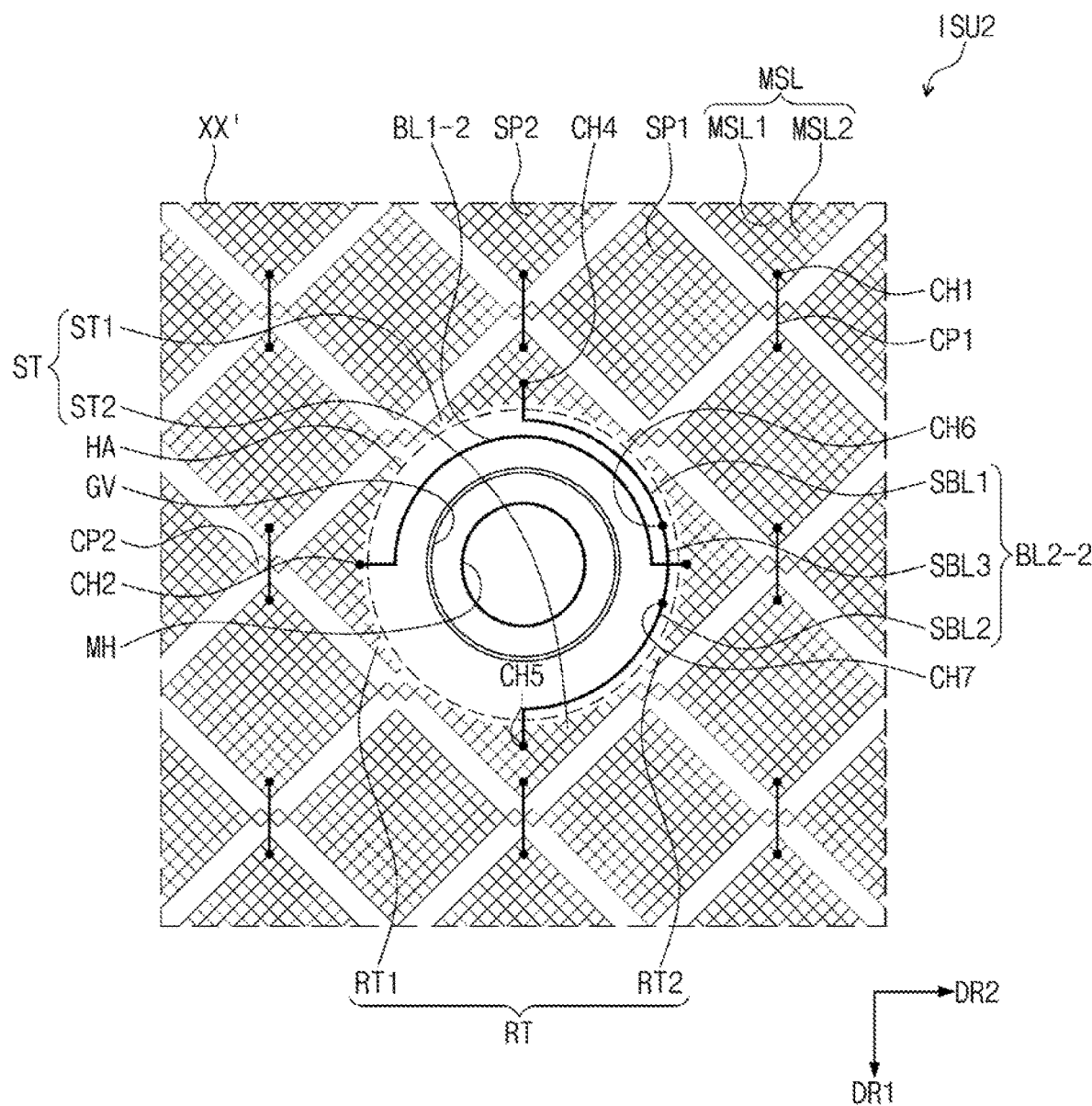

FIGS. 10 and 11 are plan views of a pan of an input detection unit according to another embodiment of the inventive concept. FIGS. 10 and 11 show the area XX' of FIG. 2 in another embodiment of the inventive concept.

The input detection units ISU1 and ISU2 to be described with reference to FIGS. 10 and 11 will be described mainly with reference to differences from the input detection unit ISU described with reference to FIG. 9.

Referring to FIG. 10, according to an embodiment, the input detection unit ISU1 includes a second bridge line BL2-1.

According to an embodiment, the second bridge line BL2-1 connects the first sensing touch pattern RT1 and the second sensing touch pattern RT2 in the routing area RA.

According to an embodiment, the second bridge line BL2-1 is disposed on a different layer from the sensing touch sensor units SP2, the second connection parts CP2, and the transmission touch sensor units SP1. Specifically, the second bridge line BL2-1 is disposed on the same layer as the first connection parts CP1. That is, the second bridge line BL2-1 is included in the second conductive layer MTL2 (see FIG. 5).

According to an embodiment, the second bridge line BL2-1 is connected to the first sensing touch pattern RT1 and the second sensing touch pattern RT2 through the contact hole CH2. The contact hole CH2 is provided in the first touch insulating layer TSL1 of FIG. 5. The second bridge line BL2-1 is disposed on a different layer from the sensing touch sensor units SP2, second connection parts CP2 and transmission touch sensor units SP1 to improve freedom of design.

According to an embodiment, the transmission touch pattern ST and the sensing touch pattern RT of the input detection unit ISU1 extend into the routing area RA. The transmission touch pattern ST and the sensing touch pattern RT extend into the routing area RA in the hole area HA as compared with the embodiment of FIG. 9, so that a touch recognition area can extend closer to the module hole MH.

According to an embodiment, since the second bridge line BL2-1 is disposed on a different layer from the transmission touch pattern ST and the sensing touch pattern RT, even if it overlaps the transmission touch pattern ST and the sensing touch pattern RT, it is electrically insulated.

According to an embodiment, the input detection unit ISU1 of FIG. 10 does not include the first bridge line BL1, unlike the input detection unit ISU described with reference to FIG. 9.

Therefore, according to an embodiment, the first transmission touch pattern ST1 and the second transmission touch pattern ST2 are not electrically connected to each other.

As described with reference to FIG. 6, according to an embodiment, the first to fourth transmission lines TL1 to TL4 of the transmission lines TL1 to TL8 are connected to one ends of the transmission touch lines TX1 to TX4, and the fifth to eighth transmission lines TL5 to TL8 are connected to the other ends of the transmission touch lines TX1 to TX4.

According to an embodiment, since each of the transmission touch lines TX1 to TX4 receives a touch driving signal from both ends, the first transmission touch pattern ST1 and the second transmission touch pattern ST2 around the module hole MH can be electrically-disconnected.

In the case where the input detection unit ISU1 includes a second bridge line like FIG. 9, if the second bridge line BL2-1 is arranged on the same layer as the first connection parts CP1, an electrical connection may occur at the intersection of the second bridge line BL2-1 and the second bridge line. But, since the input detection unit ISU1 according to an embodiment of the inventive concept does not include a second bridge line, even if the second bridge line BL2-1 is disposed on the same layer as the first connection parts CP1, an electrical connection to the second bridge line will not occur.

Referring to FIG. 11, according to an embodiment, the input detection unit ISU2 includes a second bridge line BL2-2 and a first bridge line BL1-2.

According to an embodiment, the second bridge line BL2-2 connects the first sensing touch pattern RT1 and the second sensing touch pattern RT2 in the routing area RA. The first bridge line BL1-2 connects the first transmission touch pattern ST1 and the second transmission touch pattern ST2 in the routing area RA.

According to an embodiment, the second bridge line BL2-2 is disposed on a different layer from the sensing touch sensor units SP2, the second connection parts CP2, and the transmission touch sensor units SP1. Specifically, the second bridge line BL2-2 is disposed on the same layer as the first connection parts CP1. That is, the second bridge line BL2-2 is included in the second conductive layer MTL2 (see FIG. 5).

According to an embodiment, the second bridge line BL2-2 is connected to the first sensing touch pattern RT1 and the second sensing touch pattern RT2 through the contact hole CH2. The contact hole CH2 is provided in the first touch insulating layer TSL1 of FIG. 4.

According to an embodiment, the first bridge line BL1-2 includes first to third sub-bridge lines SBL1, SBL2 and SBL3.

According to an embodiment, one end of the first sub-bridge line SBL1 is connected to the first transmission touch pattern ST1 and one end of the second sub-bridge line SBL2 is connected to the second transmission touch pattern ST2. The third sub-bridge line SBL3 is connected between the other ends of the first sub-bridge line SBL1 and the second sub-bridge line SBL2.

According to an embodiment, the first sub-bridge line SBL1 and the second sub-bridge line SBL2 are disposed on the same layer as the second bridge line BL2-2.

According to an embodiment, one end of the first sub-bridge line SBL1 is connected to the first transmission touch pattern ST1 through the contact hole CH4. The contact hole CH4 is provided in the first touch insulating layer TSL1 of FIG. 5.

According to an embodiment, one end of the second sub-bridge line SBL2 is connected to the second transmission touch pattern ST2 through the contact hole CH5. The contact hole CH5 is provided in the first touch insulating layer TSL1 of FIG. 5.

According to an embodiment, the third sub-bridge line SBL3 is disposed on a different layer from the first and second sub-bridge lines SBL1 and SBL2. The third sub-bridge line SBL3 is disposed on the same layer as the sensing touch sensor units SP2, the second connection parts CP2, and the transmission touch sensor units SP1.

According to an embodiment, one end of the third sub-bridge line SBL3 is connected to the other end of the first sub-bridge line SBL1 through the contact hole CH6, and the other end of the third sub-bridge line SBL3 is connected to the other end of the second sub-bridge line SBL2 through the contact hole CH7. Contact holes CH6 and CH7 overlap both ends of the third sub-bridge line SBL3 and are disposed in the routing area RA.

According to an embodiment, the second bridge line BL2-2 and the third sub-bridge line SBL3 cross each other on a plane, but are disposed on different layers, and thus are not electrically connected.

Therefore, according to an embodiment, in relation to the input detection unit ISU2 according to the embodiment of FIG. 11, by adding a second bridge line that includes sub-bridge lines disposed on different layers, unlike an embodiment of FIG. 10, the signals transmitted through the transmission touch lines TX1 to TX4 are maintained constant to ensure stable touch sensitivity.

Figure 12:
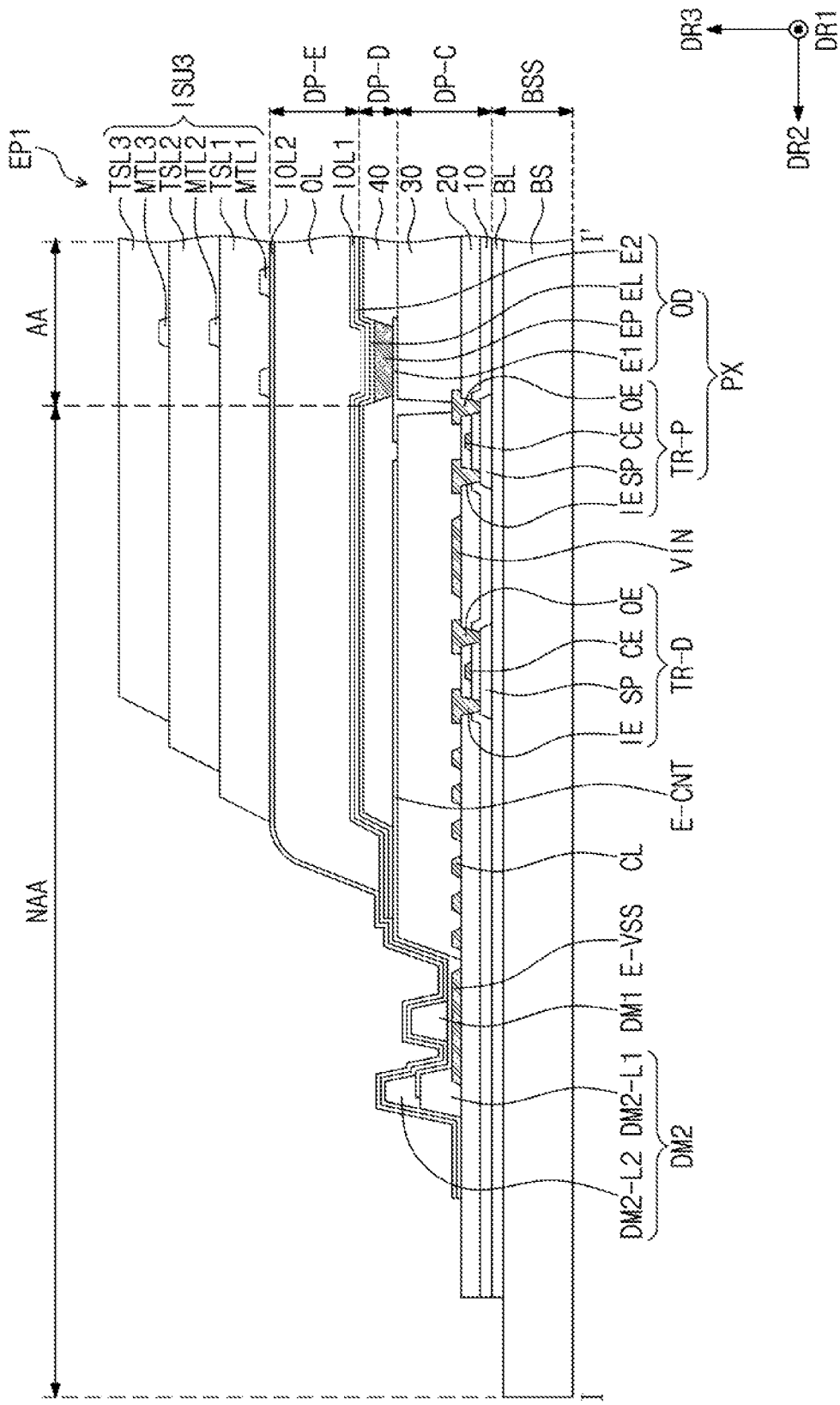
FIG. 12 is a cross-sectional view taken along a line I-I' of FIG. 2 in a display panel according to another embodiment of the inventive concept.
Figure 13:
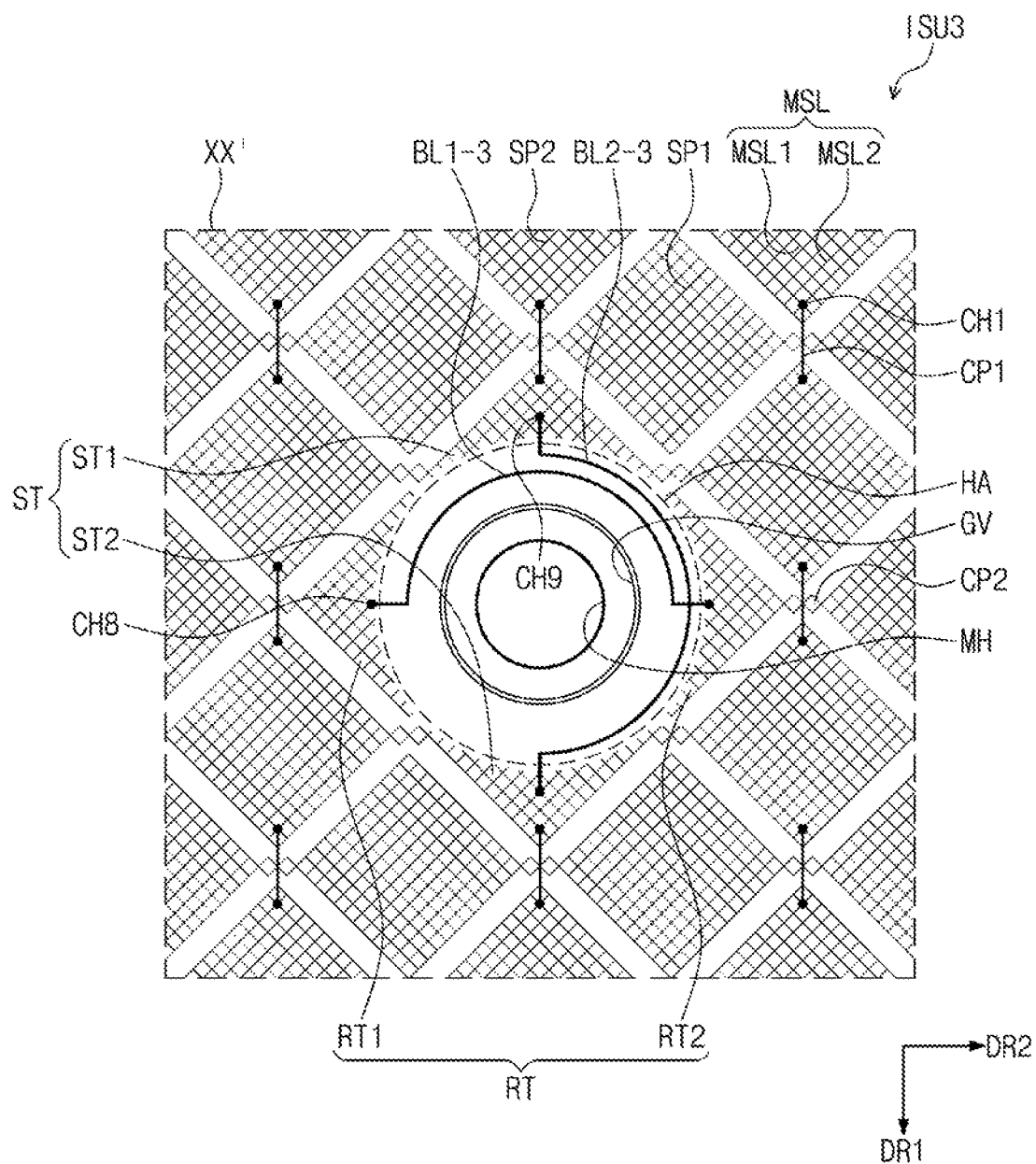
FIG. 13 is a plan view of a part of an input detection unit according to the embodiment of FIG. 12.

FIG. 12 is a cross-sectional view taken along a line I-I' of FIG. 2 in a display panel according to another embodiment of the inventive concept. FIG. 13 is a plan view of a part of an input detection unit according to an embodiment of FIG. 12. FIG. 13 shows the area XX' of FIG. 2 in another embodiment of the inventive concept.

An input detection unit ISU3 to be described with reference to FIGS. 12 and 13 will be described mainly with respect to differences from the input detection unit ISU described with reference to FIGS. 4 and 9.

Referring to FIG. 12, according to an embodiment, compared to the input detection unit ISU described with reference to FIG. 4, the input detection unit ISU3 of a display panel EP1 further includes a third conductive layer MTL3 and a third touch insulating layer TSL3.

According to an embodiment, the third conductive layer MTL3 is disposed on the second touch insulating layer TSL2. The third conductive layer MTL3 includes a conductive material. For example, the third conductive layer MTL3 includes at least one of a metal, a transparent conductive oxide, or a conductive polymer. The third conductive layer MTL3 may have a plurality of layers, but is not limited thereto.

According to an embodiment, the third conductive layer MTL3 is electrically connected to the second conductive layer MTL2 through a contact hole that penetrates the second touch insulating layer TSL2. However, embodiments of the inventive concept are not limited thereto, and the third conductive layer MTL3 can be electrically connected to the first conductive layer MTL1 through a contact hole that penetrates the first and second touch insulating layers TSL1 and TSL2.

Referring to FIG. 13, according to an embodiment, the input detection unit ISU3 includes a second bridge line BL2-3 and a first bridge line BL1-3.

According to an embodiment, the second bridge line BL2-3 connects the first sensing touch pattern RT1 and the second sensing touch pattern RT2 in the routing area RA. The first bridge line BL1-3 connects the first transmission touch pattern ST1 and the second transmission touch pattern ST2 in the routing area RA.

According to an embodiment, the second bridge line BL2-3 is disposed on a different layer from the sensing touch sensor units SP2, the second connection parts CP2, and the transmission touch sensor units SP1. Specifically, the second bridge line BL2-3 is disposed on the same layer as the first connection parts CP1. That is, the second bridge line BL2-3 is included in the second conductive layer MTL2 (see FIG. 12).

According to an embodiment, the second bridge line BL2-3 is connected to the first sensing touch pattern RT1 and the second sensing touch pattern RT2 through the contact hole CH8. The contact hole CH8 is provided in the first touch insulating layer TSL1 of FIG. 12.

According to an embodiment, the first bridge line BL1-3 is disposed on a different layer from the sensing touch sensor units SP2, the second connection parts CP2, the transmission touch sensor units SP1, and the first connection parts CP1. The first bridge line BL1-3 is included in the third conductive layer MTL3 (see FIG. 12).

According to an embodiment, the first bridge line BL1-3 is connected to the first transmission touch pattern ST1 and the second transmission touch pattern ST2 through the contact hole CH9. The contact hole CH9 is provided in the second touch insulating layer TSL2 of FIG. 12.

However, embodiments of the inventive concept are not limited thereto. The second bridge line BL2-3 may be included in the third conductive layer MTL3, and the first bridge line BL1-3 may be included in the second conductive layer MTL2.

According to a display panel that includes an input detection unit according to an embodiment of the inventive concept, it is possible to increase the freedom of design in the routing area RA by including three or more conductive layers.

Figure 14:
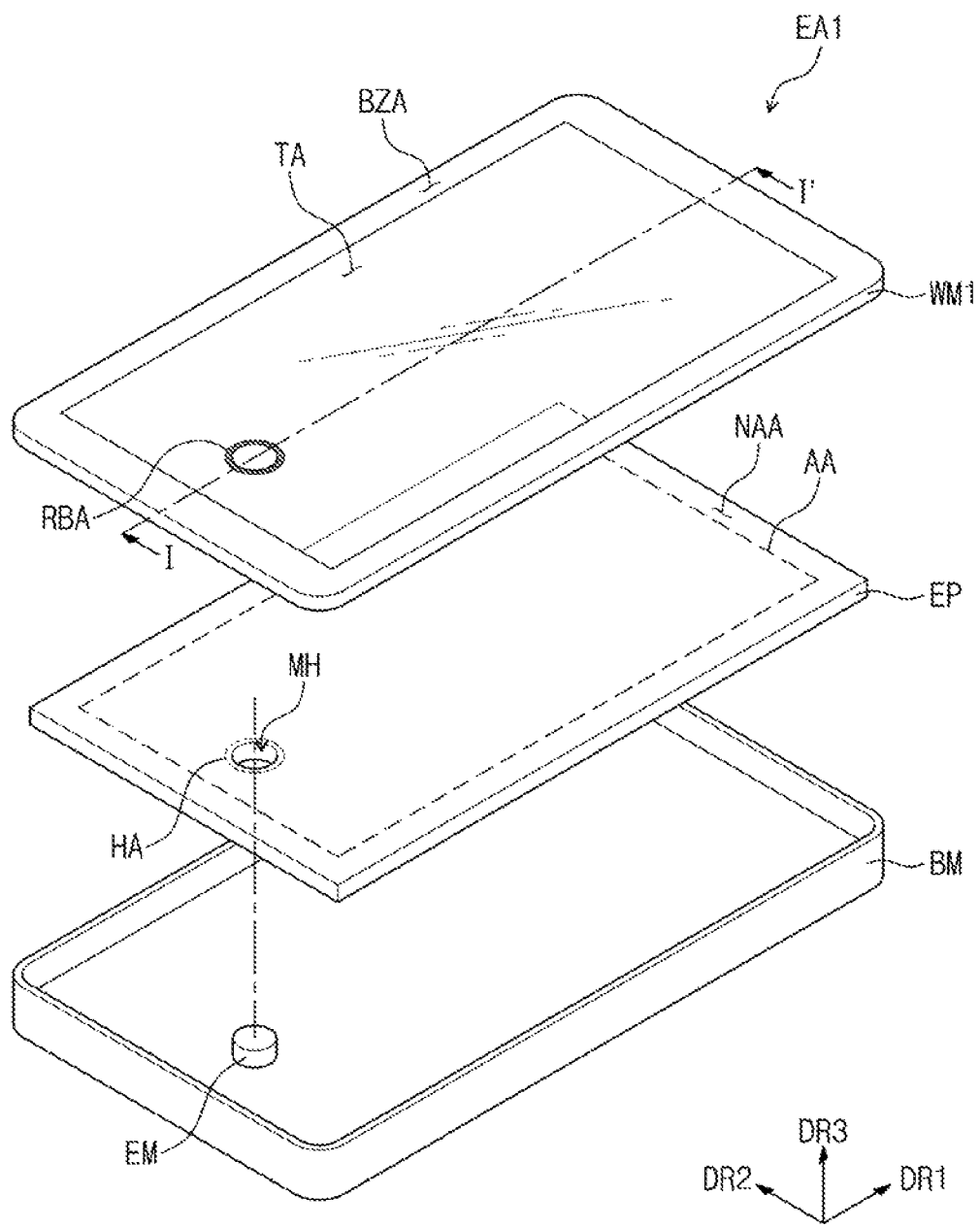
FIG. 14 is an exploded perspective view of a display device according to another embodiment of the inventive concept.
Figure 15:
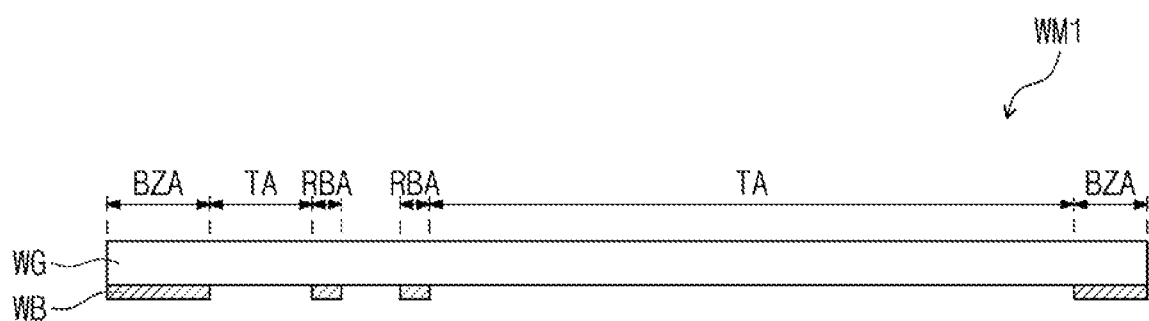
FIG. 15 is a cross-sectional view of a window member along a line I-I' in FIG. 14.

FIG. 14 is an exploded perspective view of a display device according to another embodiment of the inventive concept, and FIG. 15 is a cross-sectional view of a window member taken along a line I-I' of FIG. 14.

A display device EA1 described with reference to FIG. 14 differs from the display device EA described with reference to FIGS. 1 to 3 in a window member WM1, and the remaining components are substantially the same.

Referring to FIGS. 14 and 15, according to an embodiment, the window member WM1 is divided into a transmission area TA, a bezel area BZA, and a hole blocking area RBA.

According to an embodiment, the hole blocking area RBA has a lower light transmittance than the transmission area TA. The hole blocking area RBA overlaps a hole area HA and surrounds a module hole MH on a plane. The hole blocking area RBA has a ring shape on a plane. The hole blocking area RBA corresponds to the routing area RA described with reference to FIGS. 7 to 8.

Referring to FIG. 15, according to an embodiment, the window member WM1 includes a window substrate WG and a light blocking pattern WB.

According to an embodiment, the window substrate WG includes a glass substrate, a sapphire substrate, or a plastic film. The window substrate WG may have a multi-layer or single-layer structure.

According to an embodiment, the light blocking pattern WB is disposed under the window substrate WG. The light blocking pattern WB has a predetermined color to prevent a configuration disposed under the light blocking pattern WB from being visible.

According to an embodiment, the light blocking pattern WB is placed in the bezel area BZA and the hole blocking area RBA.

According to an embodiment of the display device EA1 described with reference to FIGS. 14 and 15, by providing the hole blocking area RBA in the window member WM1, it is possible to prevent signal lines and bridge lines arranged in the routing area RA from being externally visible.

Figure 16:
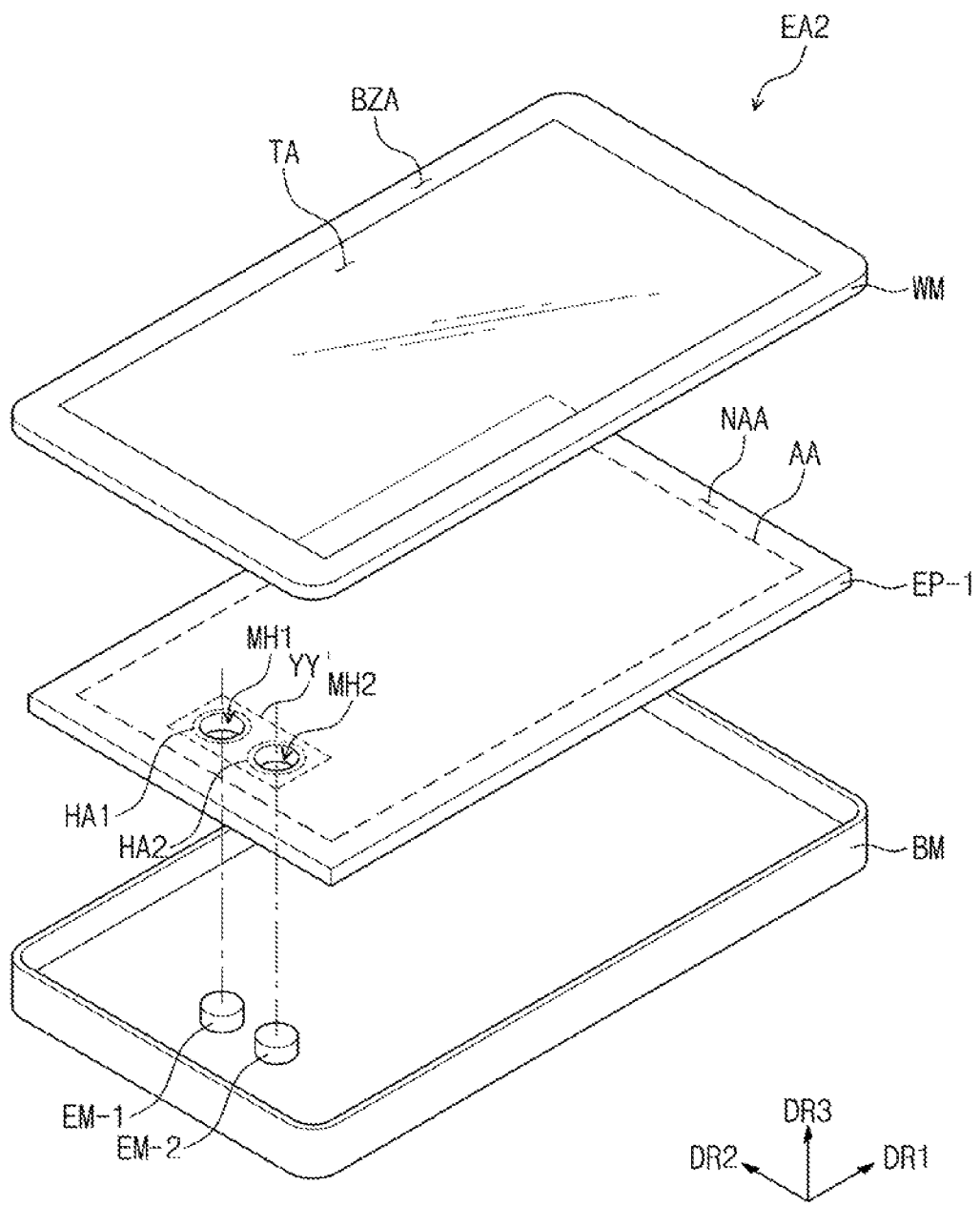
FIG. 16 is an exploded perspective view of a display device according to another embodiment of the inventive concept.
Figure 17:
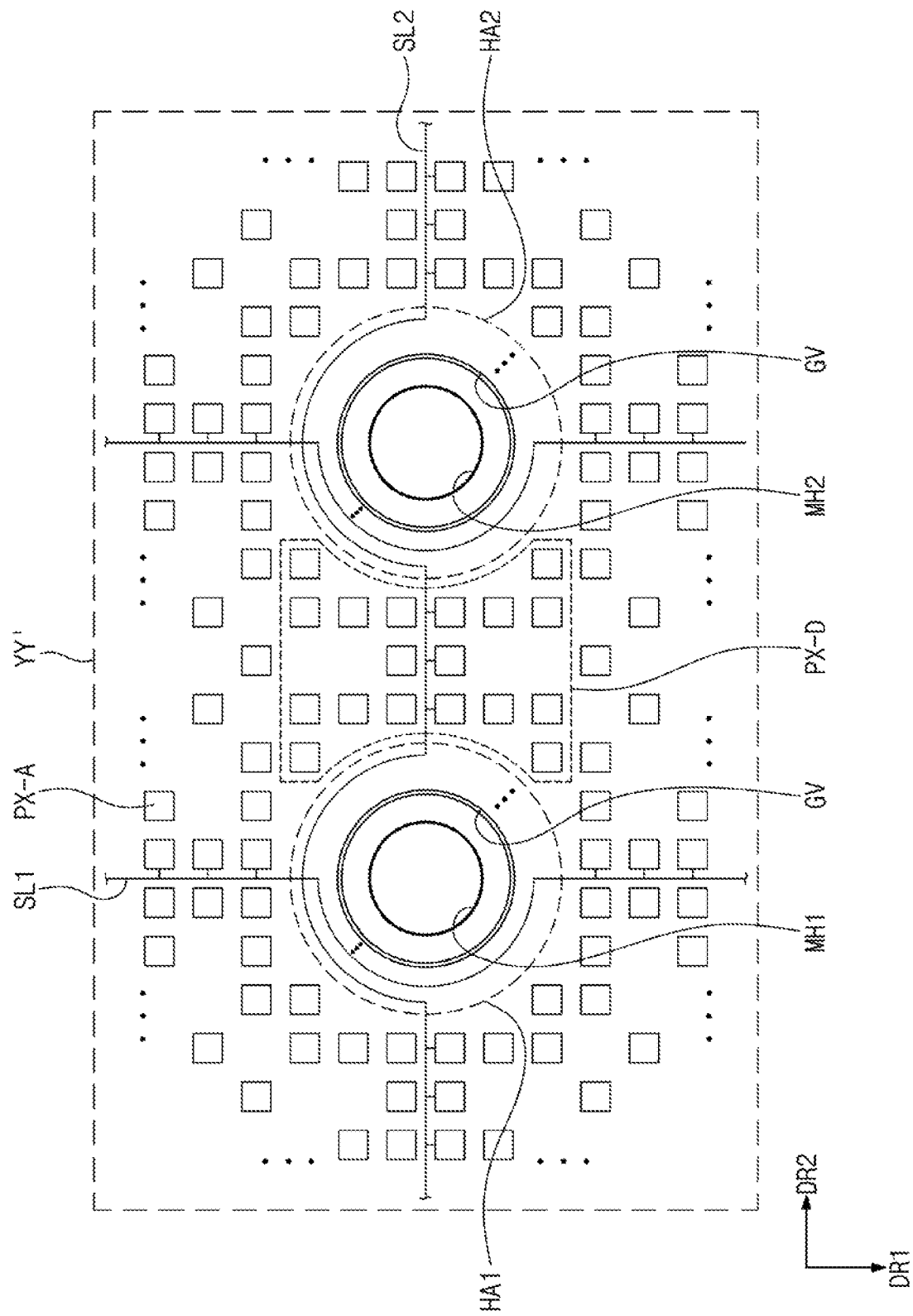
FIGS. 17 and 18 are plan views showing an area YY' in FIG. 16.
Figure 18:
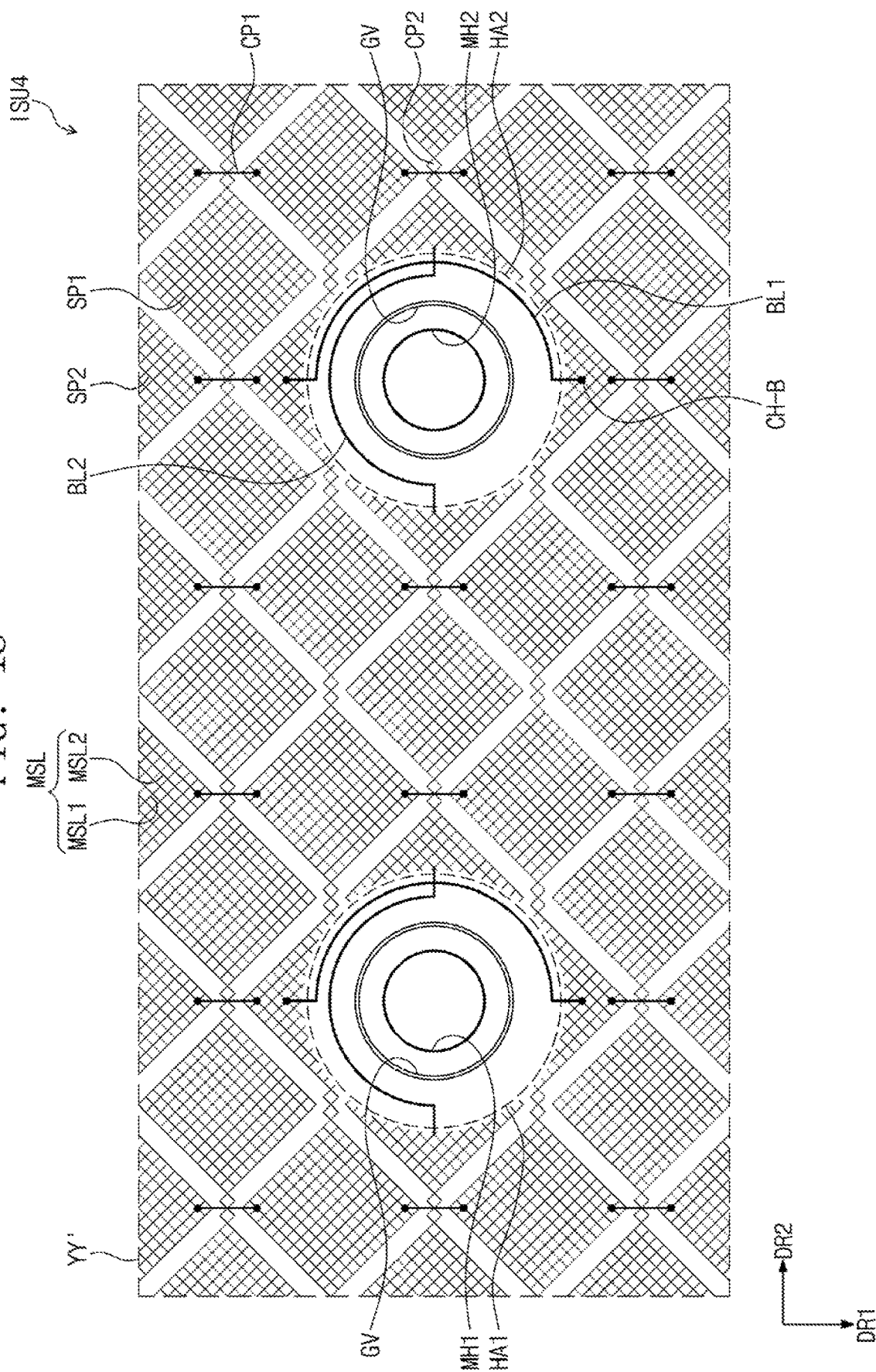

FIG. 16 is an exploded perspective view of a display device according to another embodiment of the inventive concept, and FIGS. 17 and 18 are plan view s of an area YY' shown in FIG. 16. FIG. 17 shows some of pixels and signal lines, and FIG. 18 shows an input detection unit.

According to an embodiment, a display device EA2 described with reference to FIGS. 16 to 18 differs from the display device EA described with reference to FIGS. 1 to 9 in that two module holes and two electronic modules are provided. Hereinafter, the display device EA2 of FIGS. 16 to 18 will be described mainly with respect to differences from the display device EA of FIGS. 1 to 9.

According to an embodiment, the first module hole MH1 and the second module hole MH2 are formed on the display panel EP-1 of the display device EA2. The shapes of the first module hole MH1 and the second module hole MH2 are substantially the same as those of the module hole MH described with reference to FIG. 2, and thus a detailed description thereof will be omitted.

According to an embodiment, the first module hole MH1 and the second module hole MH2 are adjacent to each other and the first module hole MH1 and the second module hole MH2 are formed adjacent to each other in the second direction DR2.

According to an embodiment, the display panel EP-1 includes an active area AA, a peripheral area NAA, a first hole area HA1, and a second hole area HA2, which are separated on a plane.

According to an embodiment, the first hole area HA1 is where the first module hole MH1 is formed and the second hole area HA2 is the second module hole MH2 is formed. The first hole area HA1 and the second hole area HA2 are surrounded by the active area AA.

According to an embodiment, the display device EA2 includes a first sub-electronic module EM-1 and a second sub-electronic module EM-2 which respectively overlap the first module hole MH1 and the second module hole MH2. Each of the first sub-electronic module EM-1 and the second sub-electronic module EM-2 may be any one of modules of the first electronic module EM1 and the second electronic module EM2 described with reference to FIG. 3.

Referring to FIGS. 16 and 17, according to an embodiment, pixels provided in the display panel EP-1 include first pixels PX-D disposed between the first hole area HA1 and the second hole area HA2 and second pixels PX-A.

According to an embodiment, the first pixels PX-D are disposed between the first hole area HA1 and the second hole area HA2 in the second direction DR2. The second pixels PX-A are not disposed between the first hole area HA1 and the second hole area HA2.

According to an embodiment, the first pixels PX-D and the second pixels PX-A are all connected to the gate line GL (see FIG. 5) and the data line DL (see FIG. 5) and are all connected to wires that drive the pixel, such as a power supply line E-VSSM (see FIG. 4) and an initialization voltage line VIN (see FIG. 4).

According to an embodiment, the second pixels PX-A can output images of various gradations corresponding to the data signals transmitted through the data lines DL (see FIG. 5).

According to an embodiment, the first pixels PX-D can output a black image. In an embodiment, the data signal transmitted to the first pixels PX-D includes black gradation information. However, embodiments of the inventive concept are not limited thereto, and the first pixels PX-D may lack the light-emission pattern LP in the organic light emitting diode OD (see FIG. 5), so that the organic light emitting diode OD (FIG. 5) of the first pixels PX-D does not emit light.

Referring to FIG. 18, according to an embodiment, the sensing touch sensor units SP2, the transmission touch sensor units SP1, the second connection parts CP2, and the first connection parts CP1 of the input detection unit ISU4 are disposed between the first hole area HA1 and the second hole area HA2.

Therefore, in the display device EA2 according to an embodiment of the inventive concept, although substantially no image is displayed between the first hole area HA1 and the second hole area HA2, an applied touch can be sensed, such that deterioration of the touch sensitivity can be prevented.

Figure 19:
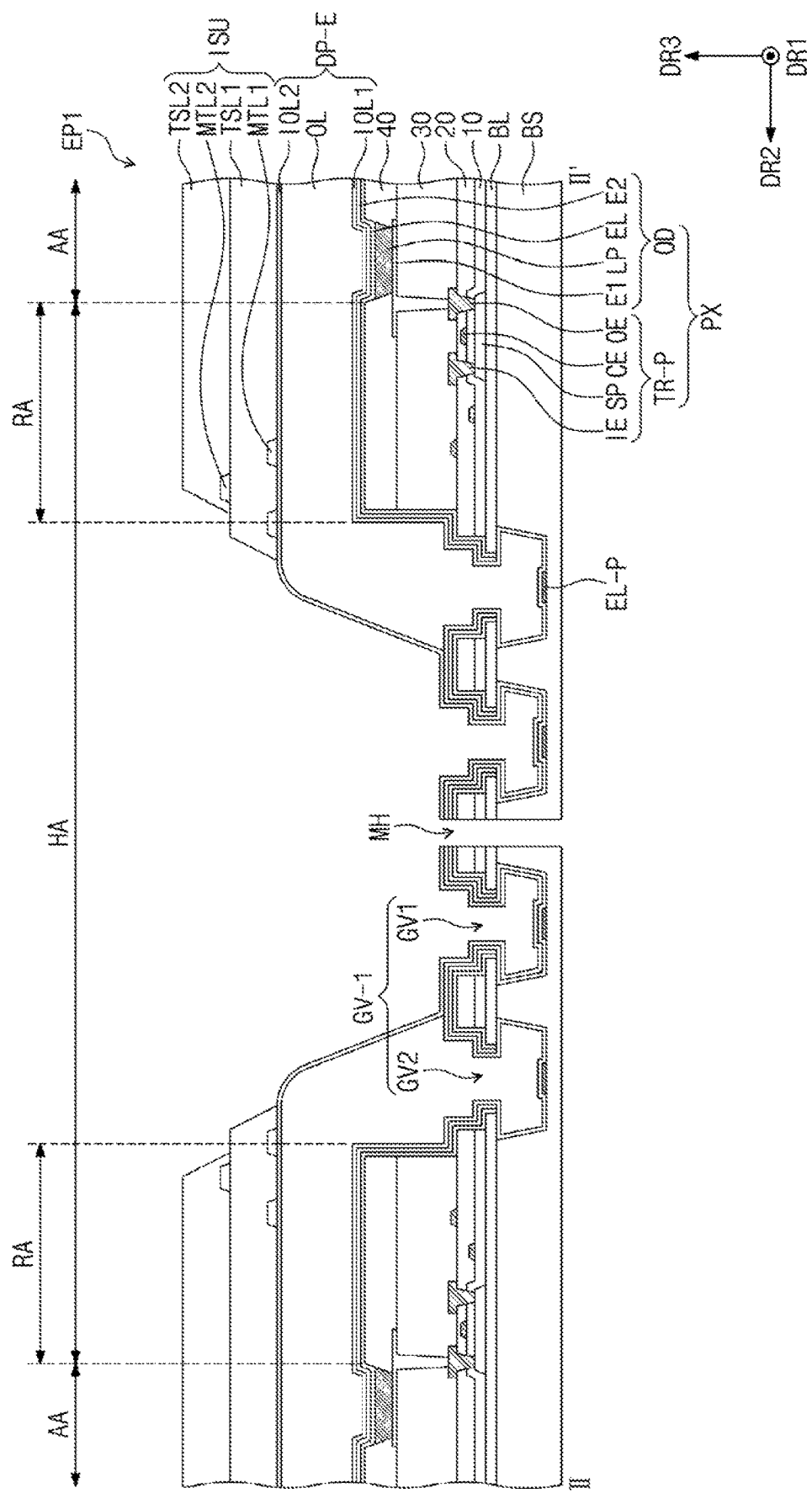
FIG. 19 is a cross-sectional view taken along a line II-II' in FIG. 2 in a display device according to another embodiment of the inventive concept.

FIG. 19 is a cross-sectional view taken along a line II-II' in FIG. 2 in a display device according to another embodiment of the inventive concept Hereinafter, differences with respect to the display panel EP described with reference to FIG. 7 will be mainly. The depression pattern GV-1 includes a first depression pattern GV1 and a second depression pattern GV2. On a plane, the first depression pattern GV1 surrounds the module hole MH and the second depression pattern GV2 surrounds the first depression pattern GV1. The module hole MH, the first depression pattern GV1, and the second depression pattern GV2 are spaced from each other. In another embodiment of the inventive concept, the depression pattern GV-1 may further include at least one blocking groove spaced from the second depression pattern GV2 and surrounding the second depression pattern GV2.

According to an embodiment, the specific shapes of the first depression pattern GV1 and the second depression pattern GV2 are substantially the same as those of the depression pattern GV described with reference to FIG. 7, and thus a detailed description thereof will be omitted.

According to an embodiment, the first inorganic layer IOL1 extends to an area where the first and second depression patterns GV1 and GV2 are formed. The first inorganic layer IOL1 is disposed along the area adjacent to the first and second depression patterns GV1 and GV2 and the inner surface of the first and second depression patterns GV1 and GV2. Accordingly, the insides of the first and second depression patterns GV1 and GV2 are covered by the first inorganic layer IOL1.

According to an embodiment, the organic layer OL of the sealing layer DP-E fills the second depression pattern GV2 but does not fill the first depression pattern GV1.

According to an embodiment, the second inorganic layer IOL2 extends to an area where the first and second depression patterns GV1 and GV2 are formed. The second inorganic layer IOL2 is disposed along the area adjacent to the first and second depression patterns GV1 and GV2 and the inner surface of the first depression pattern GV1.

Therefore, according to an embodiment, the inside of the first depression pattern GV1 is covered by the second inorganic layer IOL2. Since the second depression pattern GV2 is filled with the organic layer OL, the second inorganic layer IOL2 is not disposed on the inner surface of the second depression pattern GV2. The organic layer OL is disposed between the first inorganic layer IOL1 and the second inorganic layer IOL2 in the area that overlaps the second depression pattern GV2.

According to an embodiment, the first conductive layer TSL1 and the second conductive layer TSL2 overlap the second depression pattern GV2 in the hole area HA. The first conductive layer TSL1 and the second conductive layer TSL2 are disposed in an area between the routing area RA and the module hole MH. That is, when the organic layer OL fills the second depression pattern GV2, the first conductive layer TSL1 and the second conductive layer TSL2 overlap with the second depression pattern GV2, so that they may be disposed closer to the hole MH. According to an embodiment, the first to fourth signal lines SL1 to SL4 described with reference to FIG. 8 are disposed in the routing area RA without overlapping the second depression pattern GV2.

Therefore, according to an embodiment of FIG. 19, the lengths of the first and second bridge lines BL1 and BL2 described with reference to FIG. 9 are shorter than those of an embodiment described with reference to FIG. 9, so that wiring resistance cart be reduced.

According to a display device according to embodiments of the inventive concept, by connecting pixels or touch sensor units spaced around the module hole through signal lines or bridge lines, the organic/electrical coupling between the pixels or the touch sensor units spaced around the module hole can be maintained to facilitate the electrical control of the pixels. Thus, even if a module hole is surrounded by the active area, it is possible to stably drive the active area of the display device.

Further, by arranging the bridge lines in a routing area in a hole area HA, the touch sensor units may be electrically connected to each other without deteriorating the displayed image quality, and the display quality can be improved because is the bridge lines are not externally visible.

Although the exemplary embodiments of the inventive concept have been described, it is understood that embodiments of the inventive concept should not be limited to exemplary embodiments but various changes and modifications may be made by those ordinary skilled in the art within the spirit and scope of embodiments of the inventive concept as hereinafter claimed.

What is claimed is:

1. A display device comprising:
    a base substrate that includes a front surface and a back surface that face each other, wherein the base substrate includes
        an active area,
        a peripheral area adjacent to the active area,
        a module hole formed in the active area that penetrates the front surface and the back surface, and
        a routing area that surrounds the module hole and is surrounded by the active area;
    an input detection unit disposed on the base substrate, wherein the input detection unit comprises:
        first touch sensor units arranged along a first direction;
        a first connection part that connects adjacent first touch sensor units;
        second touch sensor units arranged in a second direction that intersects the first direction;
        a second connection part that connects adjacent second touch sensor units and is disposed on a different layer from the first connection part;
        a first bridge line connected to first touch sensor units adjacent to each other in the first direction with the module hole therebetween, and
        a second bridge line disposed in the routing area and connected to second touch sensor units adjacent to each other in the second direction with the module hole therebetween, wherein the second bridge line intersects the first bridge line on a plane.

2. The display device of claim 1, further comprising:
    a circuit layer disposed on the base substrate and that includes a driving element that includes a thin film transistor;
    a display element layer disposed on the circuit layer and that includes an organic light emitting diode disposed in the active area: and
    a sealing layer disposed on the display element layer and that seals the organic light emitting diode, wherein the input detection unit is disposed on the sealing layer.

3. The display device of claim 2, wherein the organic light emitting diode comprises
    a first organic light emitting diode and a second organic light emitting diode adjacent to each other in the first direction with the module hole therebetween, and
    a third organic light emitting diode and a fourth organic light emitting diode adjacent to each other in the second direction with the module hole therebetween,
    wherein the driving element comprises first to fourth driving elements connected to the first to fourth organic light emitting diodes, respectively, wherein the circuit layer comprises:
    a first signal line connected to the first and second driving elements, wherein a part of the first signal line is disposed in the routing area; and
    a second signal line disposed on a different layer from the first signal line and connected to the third and fourth driving elements, wherein a part of the second signal line is disposed in the routing area.

4. The display device of claim 1,
    wherein the first touch sensor units, the second touch sensor units, and the second connection part are disposed on the same layer,
    wherein the second bridge line is disposed on the same layer as the second connection part.

5. The display device of claim 4, wherein the input detection unit further comprises:
    a first touch insulating layer disposed on the first touch sensor units, the second connection part, and the second touch sensor units; and
    a second touch insulating layer disposed on the first connection part and the first touch insulating layer,
    wherein the second bridge line is directly connected to the second touch sensor units.

6. The display device of claim 4, wherein first touch sensor units adjacent to each other in the first direction with the module hole therebetween are electrically insulated from each other.

7. The display device of claim 4, wherein the input detection unit further comprises:
    a first transmission line having one end connected to a first outer touch sensor unit disposed at an outermost position in the first direction of the first touch sensor units arranged along the first direction;
    a second transmission line having one end connected to a second outer touch sensor unit disposed at an outermost position in a direction opposite to the first direction of the first touch sensor units arranged along the first direction; and
    touch pads connected to other ends of the first and second transmission lines.

8. The display device of claim 1, wherein each of the second touch sensor units comprises
    a plurality of mesh lines that intersect the first direction and the second direction,
    wherein the second bridge line has a width greater than that of each of the mesh tines.

9. The display device of claim 1, wherein the first touch sensor units and the second touch sensor units extend into the routing area.

10. The display device of claim 1,
    wherein the first bridge line is connected to the first touch sensor units through a contact hole provided in the first touch insulating layer and the first bridge line is disposed in the routing area.

11. The display device of claim 1, wherein each of the first touch sensor units comprises
    a plurality of mesh lines that intersect the first direction and the second direction,
    wherein the first bridge line has a width greater than that of each of the mesh lines.

12. The display device of claim 1,
    wherein the second bridge line is disposed on the same layer as the second touch sensor units,
    wherein the first bridge line is disposed on the same layer as the first connection part.

13. The display device of claim 1, wherein the input detection unit further comprises:

a first touch insulating layer disposed on the first touch sensor units, the first connection parts, and the second touch sensor units, and
a second touch insulating layer disposed on the first connection part and the first touch insulating layer,
wherein the second bridge line is disposed on the first touch insulating layer under the second touch insulating layer and is connected to the first touch sensor units through a contact hole provided in the first touch insulating layer.

14. The display device of claim 1,
wherein the second bridge line is disposed on the same layer as the first connection part,
wherein the first bridge line comprises:
   first and second sub-bridge lines disposed on the same layer as the second bridge line and connected to each of the first touch sensor units adjacent to each other in the first direction with the module hole therebetween; and
   a third sub-bridge line disposed on a different layer from the second bridge line and crossing the second bridge line on a plane, and connected between the first and second sub-bridge lines.

15. The display device of claim 14, wherein the input detection unit further comprises:
   a first touch insulating layer disposed on the first touch sensor units, the second connection parts, and the second touch sensor units; and
   a second touch insulating layer disposed on the first connection part and the first touch insulating layer
   wherein the third sub-bridge line is disposed in the routing area and is connected to the first and second sub-bridge lines through contact holes provided in the first touch insulating layer.

16. The display device of claim 1,
wherein the second bridge line is disposed on the same layer as the first connection part,
wherein the first bridge line is disposed on a different layer from the first touch sensor units, the first connection part, the second touch sensor units, the second connection part, and the second bridge line.

17. The display device of claim 16, wherein the input detection unit comprises:
   a first touch insulating layer disposed on the first touch sensor units, the second connection parts, and the second touch sensor units;
   a second touch insulating layer disposed on the first touch insulating layer; and
   a third touch insulating layer disposed on the second touch insulation layer,
   wherein the first bridge line is disposed on the second touch insulating layer and is connected to the first touch sensor units through a contact hole provided in the first touch insulating layer and the second touch insulating layer.

18. The display device of claim 1, wherein the base substrate is provided with a depression pattern surrounding the module hole between the routing area, and the module hole on a plane.

19. The display device of claim 18,
wherein the base substrate comprises a base layer and an auxiliary layer that cover the front surface of the base layer,
wherein the depression pattern penetrates the auxiliary layer and into the base layer.

20. A display device comprising:
a base substrate that includes a front surface and a back surface that face each other, wherein the base substrate includes
   an active area,
   a peripheral area adjacent to the active area,
   a module hole formed in the active area that penetrates the front surface and the back surface, and
   a hole area that surrounds the module hole;
a circuit layer disposed on the base substrate and that includes a thin film transistor;
a display element layer disposed on the circuit layer and that includes an organic light emitting diode disposed in the active area;
a sealing layer disposed on the display element layer and that seals the organic light emitting diode; and
an input detection unit disposed on the sealing layer, wherein the input detection unit comprises:
   a first touch line that includes first touch sensor units arranged along a first direction;
   a second touch line insulated from and intersecting with the first touch line in a second direction that crosses the first direction; and
   bridge lines disposed in the hole area,
   wherein one bridge line of the bridge lines connects to first touch sensor units adjacent in the first direction with the module hole therebetween, and
   the other bridge line of the bridge lines connects to first touch sensor units adjacent in the second direction with the module hole therebetween, and the other bridge line intersects one bridge line on a plane.

21. A display device comprising;
a base substrate that includes a front surface, and a back surface that face each other, wherein the base substrate includes
   an active area,
   a peripheral area adjacent to the active area,
   a module hole formed in the active area that penetrates the front surface and the back surface, and
   a routing area that surrounds the module hole; and
an input detection unit disposed on the base substrate, wherein the input detection unit comprises:
   first touch sensor units arranged along a first direction;
   a first connection part that connects adjacent first touch sensor units;
   second touch sensor units arranged in a second direction that intersects the first direction;
   a second connection part that connects adjacent second touch sensor units and is disposed on a different layer from the first connection part;
   a second bridge line disposed in the routing area and connected to second touch sensor units adjacent to each other in the second direction with the module hole therebetween; and
   a first bridge line disposed in the routing area and connected to first touch sensor units adjacent to each other in the first direction with the module hole therebetween, wherein the first bridge line insulated from and crosses the second bridge line.

22. The display device of claim 21, wherein the base substrate includes a depression pattern that surrounds the module hole between the routing area and the module hole.

23. The display device of claim 21, further comprising:
   a circuit layer disposed on the base substrate and that includes a driving element that includes a thin film transistor;

a display element layer disposed on the circuit layer and that includes an organic light emitting diode disposed in the active area; and a sealing layer disposed on the display element layer and that seals the organic light emitting diode, wherein the input detection unit is disposed on the sealing layer.

24. The display device of claim 23, wherein the organic light emitting diode comprises a first organic light emitting diode and a second organic light emitting diode adjacent to each other in the first direction with the module hole therebetween, and a third organic light emitting diode and a fourth organic light emitting diode adjacent to each other in the second direction with the module hole therebetween, wherein the driving element comprises first to fourth driving elements connected to the first to fourth organic light emitting diodes, respectively, wherein the circuit layer comprises:

a first signal fine connected to the first and second driving elements, wherein a part of the first signal is disposed in the routing area; and a second signal line disposed on a different layer from the first signal line and connected to the third and fourth driving elements, wherein a pan of the second signal fine is disposed in the routing area.

* * * * *